(12) United States Patent
Avraham et al.

(10) Patent No.: US 10,998,041 B1
(45) Date of Patent: May 4, 2021

(54) CALIBRATING NON-VOLATILE MEMORY READ THRESHOLDS

(71) Applicant: Western Digital Technologies, Inc., San Jose, CA (US)

(72) Inventors: Dudy Avraham, Even Yehuda (IL); Alex Bazarsky, Atir yeda Kfar Saba (IL); Rotem Feinblat, Hod Hasharon (IL); David Rozman, Kiryat-Malachi (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/869,424

(22) Filed: May 7, 2020

(51) Int. Cl.
*G11C 7/00* (2006.01)
*G11C 11/56* (2006.01)
*G11C 16/34* (2006.01)
*G11C 16/26* (2006.01)
*G11C 16/04* (2006.01)

(52) U.S. Cl.
CPC ...... *G11C 11/5642* (2013.01); *G11C 11/5671* (2013.01); *G11C 16/0483* (2013.01); *G11C 16/26* (2013.01); *G11C 16/3404* (2013.01)

(58) Field of Classification Search
CPC ....... G11C 7/1051; G11C 7/22; G11C 7/1072; G11C 7/1006; G11C 7/1066
USPC .............................. 365/189.15, 189.14, 201
See application file for complete search history.

(56) References Cited

U.S. PATENT DOCUMENTS

| | | | |
|---|---|---|---|
| 9,070,479 B2 | 6/2015 | Sharon et al. | |
| 9,640,270 B2 | 5/2017 | Alrod et al. | |
| 9,697,905 B2 | 7/2017 | Sharon et al. | |
| 9,728,263 B2 | 8/2017 | Sharon et al. | |
| 10,025,661 B1 | 7/2018 | Shukla et al. | |
| 10,180,868 B2 | 1/2019 | Alhussien et al. | |
| 10,388,934 B2 | 8/2019 | Inoue et al. | |
| 10,446,242 B2 | 10/2019 | Achtenberg et al. | |
| 10,580,485 B2 | 3/2020 | Avraham et al. | |
| 2013/0028021 A1* | 1/2013 | Sharon ............... | G11C 16/3459 365/185.17 |
| 2014/0355340 A1 | 12/2014 | Sharon et al. | |
| 2015/0085573 A1 | 3/2015 | Sharon et al. | |
| 2015/0085575 A1* | 3/2015 | Tam ..................... | G11C 29/025 365/185.11 |
| 2017/0148510 A1 | 5/2017 | Bazarsky et al. | |
| 2019/0189202 A1 | 6/2019 | Avraham et al. | |

* cited by examiner

*Primary Examiner* — Son T Dinh
(74) *Attorney, Agent, or Firm* — Patterson & Sheridan, LLP; Steven H. Versteeg

(57) ABSTRACT

In a read scan operation, a first read level window is scanned for a first candidate read level that activates the fewest number of memory cells in relation to other candidate read levels within that window. A second read level window for a second candidate read level is then configured based on a correlation between at least one of the two adjacent memory states and one or more other adjacent memory states associated with the second read level window. The second read level window is scanned for a second candidate read level that activates the fewest number of memory cells, or results in the fewest bit errors, in relation to other candidate read levels within the second read level window. Next, a read operation is configured to use the first candidate read level and the second candidate read level.

20 Claims, 15 Drawing Sheets

| | Er | A | B | C | D | E | F | G | H | I | J | K | L | M | N | P |
|---|---|---|---|---|---|---|---|---|---|---|---|---|---|---|---|---|
| Page 4 510 | 1 | 1 | 1 | 1 | 1 | 0 | 0 | 0 | 0 | 0 | 1 | 1 | 0 | 0 | 0 | 1 |
| Page 3 508 | 1 | 1 | 0 | 0 | 0 | 0 | 0 | 0 | 1 | 1 | 1 | 1 | 1 | 1 | 0 | 0 |
| Page 2 506 | 1 | 1 | 1 | 1 | 0 | 0 | 0 | 1 | 1 | 0 | 0 | 0 | 0 | 1 | 1 | 1 |
| Page 1 504 | 1 | 0 | 0 | 0 | 1 | 1 | 0 | 0 | 0 | 0 | 0 | 1 | 1 | 1 | 1 | 1 |

QLC MEMORY STATES 502

|     | Er   | A    | B    | C    | D    | E    | F    | G    | H    | I    | J    | K    | L    | M    | N    | P    |
| --- | ---- | ---- | ---- | ---- | ---- | ---- | ---- | ---- | ---- | ---- | ---- | ---- | ---- | ---- | ---- | ---- |
| Er  | 0    | 0    | 50   | 0    | 175  | 25   | 25   | 25   | 50   | 125  | 125  | 300  | 175  | 125  | 325  | 350  |
| A   | 0    | 0    | 50   | 0    | 175  | 25   | 25   | 25   | 50   | 125  | 125  | 300  | 175  | 125  | 325  | 350  |
| B   | -50  | -50  | 0    | -50  | 125  | -25  | -25  | -25  | 0    | 75   | 75   | 250  | 125  | 75   | 275  | 300  |
| C   | 0    | 0    | 50   | 0    | 175  | 25   | 25   | 25   | 50   | 125  | 125  | 300  | 175  | 125  | 325  | 350  |
| D   | -175 | -175 | -125 | -175 | 0    | -150 | -150 | -150 | -125 | -50  | -50  | 125  | 0    | -50  | 150  | 175  |
| E   | -25  | -25  | 25   | -25  | 150  | 0    | 0    | 0    | 25   | 100  | 100  | 275  | 150  | 100  | 300  | 325  |
| F   | -25  | -25  | 25   | -25  | 150  | 0    | 0    | 0    | 25   | 100  | 100  | 275  | 150  | 100  | 300  | 325  |
| G   | -25  | -25  | 25   | -25  | 150  | 0    | 0    | 0    | 25   | 100  | 100  | 275  | 150  | 100  | 300  | 325  |
| H   | -50  | -50  | 0    | -50  | 125  | -25  | -25  | -25  | 0    | 75   | 75   | 250  | 125  | 75   | 275  | 300  |
| I   | -125 | -125 | -75  | -125 | 50   | -100 | -100 | -100 | -75  | 0    | 0    | 175  | 50   | 0    | 200  | 225  |
| J   | -125 | -125 | -75  | -125 | 50   | -100 | -100 | -100 | -75  | 0    | 0    | 175  | 50   | 0    | 200  | 225  |
| K   | -300 | -300 | -250 | -300 | -125 | -275 | -275 | -275 | -250 | -175 | -175 | 0    | -125 | -175 | 25   | 50   |
| L   | -175 | -175 | -125 | -175 | 0    | -150 | -150 | -150 | -125 | -50  | -50  | 125  | 0    | -50  | 150  | 175  |
| M   | -125 | -125 | -75  | -125 | 50   | -100 | -100 | -100 | -75  | 0    | 0    | 175  | 50   | 0    | 200  | 225  |
| N   | -325 | -325 | -275 | -325 | -150 | -300 | -300 | -300 | -275 | -200 | -200 | -25  | -150 | -200 | 0    | 25   |
| P   | -350 | -350 | -300 | -350 | -175 | -325 | -325 | -325 | -300 | -225 | -225 | -50  | -175 | -225 | -25  | 0    |

| | Er | A | B | C | D | E | F | G | H | I | J | K | L | M | N | P |
|---|---|---|---|---|---|---|---|---|---|---|---|---|---|---|---|---|
| Er | 1 | 1.101 | 1.1109 | 1.1624 | 1.2166 | 1.2604 | 1.1162 | 0.9602 | 1.0343 | 1.0027 | 1.3402 | 1.0468 | 1.1817 | 1.0887 | 1.1956 | 1.0321 |
| A | 0.953 | 1 | 1.1109 | 1.1624 | 1.2166 | 1.2604 | 1.1162 | 0.9602 | 1.0343 | 1.0027 | 1.3402 | 1.0468 | 1.1817 | 1.0887 | 1.1956 | 1.0321 |
| B | 0.9001 | 0.9001 | 1 | 1.0463 | 1.0951 | 1.1346 | 1.0048 | 0.8643 | 0.931 | 0.9026 | 1.2064 | 0.9423 | 1.0637 | 0.98 | 1.0762 | 0.929 |
| C | 0.8603 | 0.8603 | 0.9558 | 1 | 1.0466 | 1.0844 | 0.9603 | 0.8261 | 0.8898 | 0.8627 | 1.153 | 0.9006 | 1.0166 | 0.9366 | 1.0286 | 0.8879 |
| D | 0.822 | 0.822 | 0.9132 | 0.9554 | 1 | 1.0361 | 0.9175 | 0.7893 | 0.8502 | 0.8242 | 1.1016 | 0.8605 | 0.9713 | 0.8949 | 0.9828 | 0.8483 |
| E | 0.7934 | 0.7934 | 0.8814 | 0.9222 | 0.9652 | 1 | 0.8856 | 0.7618 | 0.8206 | 0.7955 | 1.0633 | 0.8305 | 0.9375 | 0.8637 | 0.9486 | 0.8188 |
| F | 0.8959 | 0.8959 | 0.9953 | 1.0413 | 1.0899 | 1.1292 | 1 | 0.8602 | 0.9266 | 0.8983 | 1.2007 | 0.9378 | 1.0587 | 0.9753 | 1.0711 | 0.9246 |
| G | 1.0415 | 1.0415 | 1.157 | 1.2106 | 1.267 | 1.3127 | 1.1625 | 1 | 1.0772 | 1.0443 | 1.3957 | 1.0902 | 1.2307 | 1.1338 | 1.2452 | 1.0749 |
| H | 0.9668 | 0.9668 | 1.0741 | 1.1238 | 1.1762 | 1.2186 | 1.0792 | 0.9284 | 1 | 0.9695 | 1.2957 | 1.0121 | 1.1425 | 1.0526 | 1.156 | 0.9978 |
| I | 0.9973 | 0.9973 | 1.1079 | 1.1592 | 1.2133 | 1.257 | 1.1132 | 0.9576 | 1.0315 | 1 | 1.3365 | 1.044 | 1.1785 | 1.0857 | 1.1924 | 1.0293 |
| J | 0.7462 | 0.7462 | 0.8289 | 0.8673 | 0.9078 | 0.9405 | 0.8329 | 0.7165 | 0.7718 | 0.7482 | 1 | 0.7811 | 0.8817 | 0.8123 | 0.8921 | 0.7701 |
| K | 0.9553 | 0.9553 | 1.0612 | 1.1104 | 1.1621 | 1.2041 | 1.0663 | 0.9172 | 0.988 | 0.9579 | 1.2802 | 1 | 1.1288 | 1.04 | 1.1421 | 0.9859 |
| L | 0.8462 | 0.8462 | 0.9401 | 0.9836 | 1.0295 | 1.0666 | 0.9446 | 0.8125 | 0.8753 | 0.8485 | 1.1341 | 0.8859 | 1 | 0.9213 | 1.0118 | 0.8734 |
| M | 0.9185 | 0.9185 | 1.0204 | 1.0677 | 1.1175 | 1.1578 | 1.0253 | 0.882 | 0.95 | 0.921 | 1.231 | 0.9616 | 1.0854 | 1 | 1.0982 | 0.948 |
| N | 0.8364 | 0.8364 | 0.9292 | 0.9722 | 1.0175 | 1.0542 | 0.9336 | 0.8031 | 0.8651 | 0.8387 | 1.1209 | 0.8756 | 0.9884 | 0.9106 | 1 | 0.8632 |
| P | 0.9689 | 0.9689 | 1.0764 | 1.1262 | 1.1788 | 1.2213 | 1.0815 | 0.9304 | 1.0022 | 0.9716 | 1.2985 | 1.0143 | 1.145 | 1.0549 | 1.1585 | 1 |

FIG. 10

CALIBRATING NON-VOLATILE MEMORY READ THRESHOLDS

BACKGROUND

As NAND memory cell storage technologies progress from a single bit per memory cell (single level cell SLC) to multi-level, tri-level, and quad-level operation (storing two, three, and four bits of data, respectively per memory cell), the number of memory states defined within a voltage range (also referred to as a Vt window) increases exponentially. As a non-volatile memory device of memory cells is used, memory states may shift over time to higher threshold voltages or lower threshold voltages. Furthermore, the memory states may spread out widening and overlapping with adjacent memory states. A read scan operation, also referred to as a read level calibration, may be performed both when the non-volatile memory device is manufactured and multiple times thereafter in order to determine suitable voltage thresholds to distinguish memory states from each other and provide accurate read operations.

However, with the number of memory cells in a memory die increasing as well as the amount of data stored per cell (TLC, MLC, QLC, PLC), read scan operations may become a time consuming process. Read level calibration may be performed in response to environmental changes (such as temperature fluctuations or high device usage) and may distinguish between narrower and narrower margins between memory states. There is, therefore, a need for faster and more efficient read scan operations.

BRIEF SUMMARY

This disclosure relates to a method for an improved read scan operation, also referred to as a read level calibration scan. A first read level window, configured to test read levels between two adjacent memory states, is scanned for a first candidate read level that activates the fewest number of memory cells in relation to other candidate read levels within that first read level window. A second read level window for a second candidate read level is then configured based on a correlation between at least one of the two adjacent memory states and one or more other adjacent memory states associated with the second read level window. The second read level window is scanned for a second candidate read level that activates the fewest number of memory cells in relation to other candidate read levels within the second read level window. Finally, a read operation is configured to use the first candidate read level and the second candidate read level.

This disclosure further relates to an apparatus. This apparatus comprises a three-dimensional memory array of memory cells, a die controller, and a read scan circuit. The die controller is configured to execute storage operations with the memory cells. The read scan circuit iteratively scans a set of memory cells using a first set of candidate read levels until a candidate read level activates the fewest number of memory cells in relation to other candidate read levels within that first set of candidate read levels. The read scan circuit then determines a first read level for a first memory state based on the candidate read level that activates the fewest number of memory cells. The read scan circuit retrieves a correlation between the first memory state and a second memory state. The read scan circuit then determines a second read level for the second memory state using the correlation and sets the first read level and second read level for subsequent read operations.

Finally, this disclosure relates to a system comprising a non-volatile memory array and a storage controller. The non-volatile memory array comprises a plurality of memory dies. The storage controller comprises a read/write circuit, a read scan circuit, an error correction code decoder, and a calibration circuit. The read/write circuit writes data to memory cells of the plurality of memory dies. The read scan circuit implements read scan operations for non-volatile memory array storage blocks. These read scan operations test sets candidate read levels based on correlations between two memory cell memory states for each storage block. The error correction code decoder determines an estimated bit error rate for data read during the read scan operation. The calibration circuit calibrates memory cells based on the read levels determined by the read scan circuit.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 5 illustrates an example encoding for multi-level storage cells 500 in accordance with one embodiment.

FIG. 9 illustrates a shift correlation table 900 in accordance with one embodiment.

FIG. 10 illustrates a width correlation table 1000 in accordance with one embodiment.

DETAILED DESCRIPTION

The solution disclosed, and claimed, herein uses correlations between memory states to make read scan operations more efficient, more accurate, and faster. As certain memory states shift to higher threshold voltages or to lower threshold voltages or widen or narrow, other memory states may have a correlated pattern of shifting, widening, narrowing, etc. These correlations may be positive correlations or negative correlations.

In one embodiment, correlations between a first, fully tested/checked read level for a memory state and a second read level under testing may be used to reduce the number of candidate read levels tested to find the second read level.

In another embodiment, the correlations may be used to inform a change in the predefined order in which candidate read levels are tested/checked. Both adjustments may have the effect of reducing scan time. Advantageously, embodiments of the disclosed solution leverage correlations between memory states to set or adjust read levels efficiently and effectively.

Figure 1:
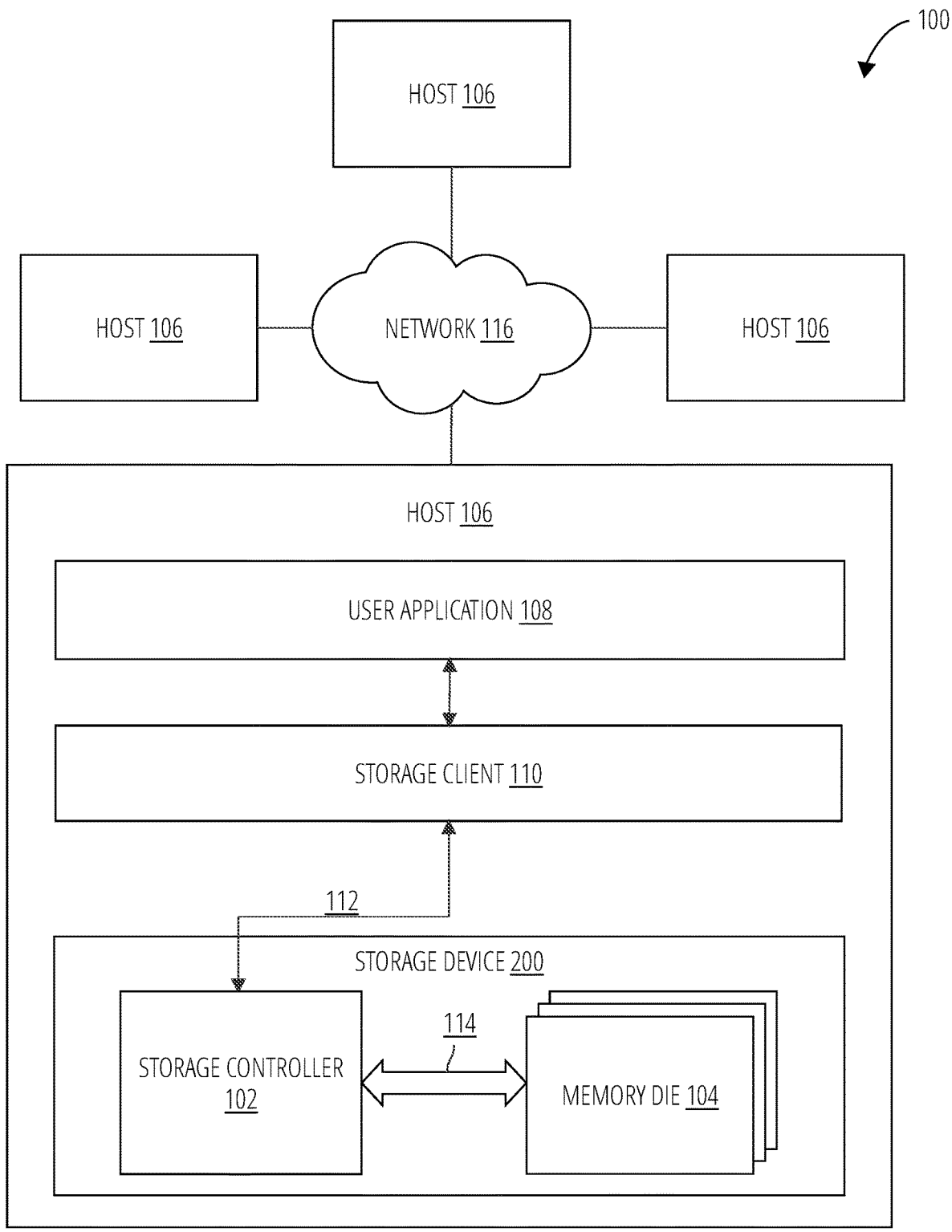
FIG. 1 illustrates a storage system 100 in accordance with one embodiment.

FIG. 1 is a schematic block diagram illustrating one embodiment of a storage system 100 that includes a storage device in accordance with the disclosed solution. The storage system 100 comprises a storage device 200, a storage controller 102, a memory die 104, at least one host 106, a user application 108, a storage client 110, a data bus 112, a bus 114, and a network 116. "Host" refers to any computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like.

"Storage command" refers to any command relating with a storage operation. Examples of storage commands include, but are not limited to, read commands, write commands, maintenance commands, configuration commands, administration commands, diagnostic commands, test mode commands, countermeasure commands, and any other command a storage controller may receive from a host or issue to another component, device, or system. "Read command" refers to a type of storage command that reads data from memory cells.

"Write command" refers to a storage command configured to direct the recipient to write, or store, one or more data blocks on a persistent storage media, such as a hard disk drive, non-volatile memory media, or the like. A write command may include any storage command that may result in data being written to physical storage media of a storage device. The write command may include enough data to fill one or more data blocks, or the write command may include enough data to fill a portion of one or more data blocks. In one embodiment, a write command includes a starting logical block address (LBA) and a count indicating the number of LBAs of data to write to on the storage media.

"Logical block address" or "LBA" refers to a value used in a block storage device to associate each of n logical blocks available for user data storage across the storage media with an address. In certain block storage devices, the LBAs may range from 0 to n per volume or partition. In block storage devices, each LBA maps directly to a particular data block, and each data block maps to a particular set of physical sectors on the physical storage media. "User data" refers to data that a host directs a non-volatile storage device to store or record.

"Data block" refers to a smallest physical amount of storage space on physical storage media that is accessible, and/or addressable, using a storage command. The physical storage media may be volatile memory media, non-volatile memory media, persistent storage, non-volatile storage, flash storage media, hard disk drive, or the like. Certain conventional storage devices divide the physical storage media into volumes or logical partitions (also referred to as partitions). Each volume or logical partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A data block or cluster represents a smallest physical amount of storage space on the storage media that is managed by a storage controller. A block storage device may associate n data blocks available for user data storage across the physical storage media with an LBA, numbered from 0 to n. In certain block storage devices, the LBAs may range from 0 to n per volume or logical partition. In conventional block storage devices, a logical block address maps directly to one and only one data block.

The storage system 100 includes at least one storage device 200, comprising a storage controller 102 and one or more memory dies 104, connected by a bus 114. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

"Memory die" refers to a small piece of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die or memory die. (Search 'die (integrated circuit)' on Wikipedia.com Oct. 9, 2019. Accessed Nov. 18, 2019.)

"Non-volatile memory array" refers to a set of non-volatile storage cells (also referred to as memory cells or non-volatile memory cells) organized into an array structure having rows and columns. A memory array is addressable using a row identifier and a column identifier.

"Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein. A memory array is addressable using a row identifier and a column identifier. "Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may comprise one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND FLASH memory (e.g., 2D NAND FLASH memory, 3D NAND FLASH memory), NOR FLASH memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, non-volatile storage media, storage, non-volatile memory, non-volatile memory medium, non-volatile storage medium, non-volatile storage, or the like. "Non-volatile storage media" refers to any hardware, device, component, element, or circuit configured to maintain an alterable physical characteristic used to represent a binary value of zero or one after a primary power source is removed. Non-volatile storage media may be used interchangeably herein with the term non-volatile memory media.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

In some embodiments, each storage device 200 may include two or more memory dies 104, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 200 may include other types of non-volatile and/or volatile data storage, such as dynamic RAM ("DRAM"), static RAM ("SRAM"), magnetic data storage, optical data storage, and/or other data storage technologies.

The storage device 200 may be a component within a host 106 as depicted in here, and may be connected using a data bus 112, such as a peripheral component interconnect express ("PCI-e") bus, a Serial Advanced Technology Attachment ("serial ATA") bus, or the like. In another embodiment, the storage device 200 is external to the host 106 and is connected, a universal serial bus ("USB") connection, an Institute of Electrical and Electronics Engineers ("IEEE") 1394 bus ("FireWire"), or the like. In other embodiments, the storage device 200 is connected to the host 106 using a peripheral component interconnect ("PCI") express bus using external electrical or optical bus extension or bus networking solution such as InfiniBand or PCI Express Advanced Switching ("PCIe-AS"), or the like.

In various embodiments, the storage device 200 may be in the form of a dual-inline memory module ("DIMM"), a daughter card, or a micro-module. In another embodiment, the storage device 200 is a component within a rack-mounted blade. In another embodiment, the storage device 200 is contained within a package that is integrated directly onto a higher-level assembly (e.g., mother board, laptop, graphics processor). In another embodiment, individual components comprising the storage device 200 are integrated directly onto a higher-level assembly without intermediate packaging. The storage device 200 is described in further detail with regard to FIG. 2.

"Processor" refers to any circuitry, component, chip, die, package, or module configured to receive, interpret, decode, and execute machine instructions. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

In a further embodiment, instead of being connected directly to the host 106 as DAS, the data storage device 200 may be connected to the host 106 over a data network. For example, the data storage device 200 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 106 and the data storage device 200.

The storage system 100 includes at least one host 106 connected to the storage device 200. Multiple hosts 106 may be used and may comprise a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 106 may be a client, and the storage device 200 may operate autonomously to service data requests sent from the host 106. In this embodiment, the host 106 and storage device 200 may be connected using a computer network, system bus, Direct Attached Storage (DAS), or other communication means suitable for connection between a computer and an autonomous storage device 200.

The depicted embodiment shows a user application 108 in communication with a storage client 110 as part of the host 106. In one embodiment, the user application 108 is a software application operating on or in conjunction with the storage client 110. "Storage client" refers to any hardware, software, firmware, or logic component or module configured to communicate with a storage device in order to use storage services. Examples of a storage client include, but are not limited to, operating systems, file systems, database applications, a database management system ("DBMS"), server applications, a server, a volume manager, kernel-level processes, user-level processes, applications, mobile applications, threads, processes, and the like.

"Software" refers to logic implemented as processor-executable instructions in a machine memory (e.g., read/write volatile memory media or non-volatile memory media).

"Hardware" refers to functional elements embodied as analog and/or digital circuitry.

"Firmware" refers to logic embodied as processor-executable instructions stored on volatile memory media and/or non-volatile memory media.

The storage client 110 manages files and data and utilizes the functions and features of the storage controller 102 and associated memory dies 104. Representative examples of storage clients include, but are not limited to, a server, a file system, an operating system, a database management system ("DBMS"), a volume manager, and the like. The storage client 110 is in communication with the storage controller 102 within the storage device 200. In some embodiments, the storage client 110 may include remote storage clients operating on hosts 106 or otherwise accessible via the network 116. Storage clients may include, but are not limited to operating systems, file systems, database applications, server applications, kernel-level processes, user-level processes, applications, and the like.

In one embodiment, the storage system 100 includes one or more clients connected to one or more hosts 106 through one or more computer networks 116. A host 106 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 116 may also include a network from the IEEE 802 family of network technologies, such Ethernet, token ring, WiFi, WiMax, and the like.

The network 116 may include servers, switches, routers, cabling, radios, and other equipment used to facilitate networking the host 106 or hosts 106 and clients. In one embodiment, the storage system 100 includes multiple hosts 106 that communicate as peers over a network 116. In another embodiment, the storage system 100 includes multiple storage devices 200 that communicate as peers over a network 116. One of skill in the art will recognize other computer networks comprising one or more computer networks and related equipment with single or redundant connection between one or more clients or other computer with one or more storage devices 200 connected to one or more hosts. In one embodiment, the storage system 100 includes two or more storage devices 200 connected through the network 116 to a remote host 106, without being directly connected to or integrated within a local host 106.

In one embodiment, the storage client 110 communicates with the storage controller 102 through a host interface comprising an Input/Output (I/O) interface. For example, the storage device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die 104. "Write once storage media" refers to a storage media such as a storage cell that is reinitialized (e.g., erased) before new data or a change to the data is written or programmed thereon. In other words, data of a write once storage media cannot be overwritten; the write once storage media must be erased before subsequently writing data to the write once storage media. "Asymmetric storage media" refers to a storage media having different latencies for different storage operations. Many types of solid-state storage media (e.g., memory dies) are asymmetric; for example, a read operation may be much faster than a write/program operation, and a write/program operation may be much faster than an erase operation (e.g., reading the storage media may be hundreds of times faster than erasing, and tens of times faster than programming the storage media).

"Read operation" refers to an operation performed on a memory cell in order to obtain, sense, detect, or determine a value for data represented by a state characteristic of the memory cell.

"Program" refers to a storage operation in which a characteristic of a memory cell is changed from a first state (often, an erased state) to a second state. A program storage operation may also be referred to as a write operation herein.

In certain embodiments, a program storage operation may include a series of iterations that incrementally change the characteristic until at least a target level of change is achieved. In other embodiments, a program storage operation may cause the attribute to change to a target level with a single iteration.

The memory die 104 may be partitioned into memory divisions that can be erased as a group (e.g., erase blocks) in order to, inter alia, account for the asymmetric properties of the memory die 104 or the like. As such, modifying a single data segment in-place may involve erasing the entire erase block comprising the data, and rewriting the modified data to the erase block, along with the original, unchanged data. This may result in inefficient write amplification, which may excessively wear the memory die 104.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block simultaneously. It is noted that physical erase blocks within a given logical erase block may be considered as contiguous within a physical address space even though they reside in separate dies. Thus, the term "contiguous" may be applicable not only to data stored within the same physical medium, but also to data stored within separate media.

Therefore, in some embodiments, the storage controller 102 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation). "Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

Management of a data block by a storage manager includes specifically addressing a particular data block for a read operation, write operation, or maintenance operation. "Maintenance operation" refers to an operation performed on a non-volatile storage device that is configured, designed, calibrated, or arranged to improve or extend the life of the non-volatile storage device and/or data stored thereon.

A block storage device may associate n blocks available for user data storage across the storage media with a logical address, numbered from 0 to n. In certain block storage devices, the logical addresses may range from 0 to n per volume or partition. "Logical address" refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like. A logical address does not indicate the physical location of data on the storage media but is an abstract reference to the data.

In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 110.

In one embodiment, the storage controller 102 provides a block I/O emulation layer, which serves as a block device interface, or API. In this embodiment, the storage client 110 communicates with the storage device through this block device interface. In one embodiment, the block I/O emulation layer receives commands and logical addresses from the storage client 110 in accordance with this block device interface. As a result, the block I/O emulation layer provides the storage device compatibility with a block storage client 110.

In one embodiment, a storage client 110 communicates with the storage controller 102 through a host interface comprising a direct interface. In this embodiment, the storage device directly exchanges information specific to non-volatile storage devices. "Non-volatile storage device" refers to any hardware, device, component, element, or circuit configured to maintain an alterable physical characteristic used to represent a binary value of zero or one after a primary power source is removed. Examples of a non-volatile storage device include, but are not limited to, a hard disk drive (HDD), Solid-State Drive (SSD), non-volatile memory media, and the like.

A storage device using direct interface may store data in the memory die 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 104. "Characteristic" refers to any property, trait, quality, or attribute of an object or thing. Examples of characteristics include, but are not limited to, condition, readiness for use, unreadiness for use, size, weight, composition, feature set, and the like.

The storage controller 102 receives a logical address and a command from the storage client 110 and performs the corresponding operation in relation to the memory die 104. The storage controller 102 may support block I/O emulation, a direct interface, or both.

Figure 2:
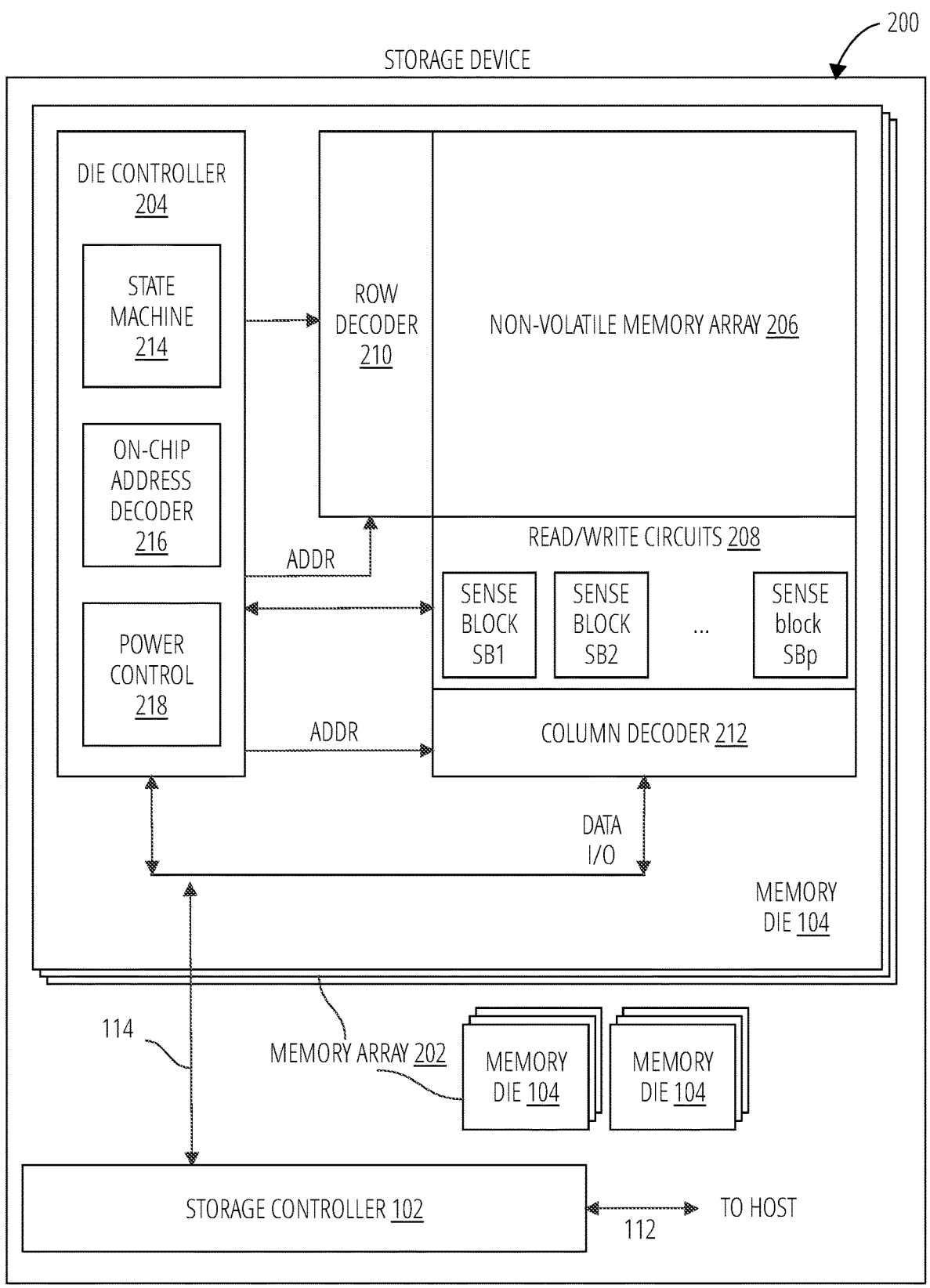
FIG. 2 illustrates a storage device 200 in accordance with one embodiment.

FIG. 2 is a block diagram of an exemplary storage device 200. "Storage device" refers to any hardware, system, subsystem, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

The storage device 200 may include a storage controller 102 and a memory array 202. Each memory die 104 in the memory array 202 may include a die controller 204, at least one non-volatile memory array 206 in the form of a three-dimensional array, and read/write circuits 208.

"Three-dimensional memory array" refers to a physical arrangement of components of a memory array which contrasts with a two-dimensional (2-D) memory array. 2-D memory arrays are formed along a planar surface of a semiconductor wafer or other substrate. A three-dimensional (3-D) memory array extends up from the wafer surface/substrate and generally includes stacks, or columns, of memory cells extending upwards, in a z-direction. In a 3-D memory array word lines comprise layers stacked one on the other as the memory array extends upwards. Various 3-D arrangements are possible. In one arrangement a NAND string is formed vertically with one end (e.g., source) at the wafer surface and the other end (e.g., drain) on top.

"Threshold voltage" refers to a voltage level that when applied to a gate terminal of a transistor causes the transistor to conduct a current between the drain electrode and source electrode.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The non-volatile memory array 206 is addressable by word line via a row decoder 210 and by bit line via a column decoder 212. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. A word line may also be referred to as a physical page or page for short. "Bit line" refers to a circuit structure configured to deliver a voltage and/or conduct current to a column of a memory array. In one embodiment, the column comprises a NAND string or memory string and may also be referred to as channel. In one embodiment, the column is referred to as a NAND string and the NAND string comprises a channel. In one embodiment, a bit line connects to a NAND string at a drain end or drain side of the NAND string. A memory array may have one bit line for each memory cell along the word lines of the memory array.

"Channel" refers to a structure within a memory array that extends from a source side to a drain side. In one embodiment, a channel is a vertical column within a memory array that forms a conductive path between a source line coupled to one end of a NAND string and a bit line coupled to another end of the NAND string. A channel may be formed from a variety of materials including, for example, polysilicon.

In one embodiment, a channel within a NAND string creates a conductive path by activating one or more memory cells (e.g., one or more selected memory cells and unselected memory cells) along the NAND string, and one or more control structures (e.g., select gates (source and/or drain) between a source line connected to one end (e.g., the source side) of the NAND string and a sense amplifier or bit line connected to the other end (e.g., the drain side) of the NAND string.

"Select gate" refers to a transistor structurally and/or electrically configured to function as a switch to electrically connect a first electrical structure connected to a source terminal of the transistor to a second electrical structure connected to the drain terminal. When functioning as a switch, the transistor is referred to herein as a 'select gate' and serves to gate (selectively) or control when, and in what quantity, a current flows or a voltage passes between the first electrical structure and the second electrical structure. Depending on the context, references to select gate herein may refer to the whole transistor or to the gate terminal of the transistor.

The read/write circuits 208 include multiple sense blocks SB1, SB2, . . . , SBp (sensing circuitry) and allow a page of memory cells to be read or programmed in parallel. In certain embodiments, each memory cell across a row of the memory array together form a physical page. "Read/write circuit" refers to a device, component, element, module, system, sub-system, circuitry, logic, hardware, or circuit configured and/or operational to read data from and write data to a storage media, such as storage cells of a storage array.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data are transferred between the host 106 and storage controller 102 via a data bus 112, and between the storage controller 102 and the one or more memory dies 104 via bus 114. The storage controller 102 may comprise the logical modules described in more detail with respect to FIG. 1.

The non-volatile memory array 206 can be two-dimensional (2D—laid out in a single fabrication plane) or three-dimensional (3D—laid out in multiple fabrication planes). The non-volatile memory array 206 may comprise one or more arrays of memory cells including a 3D array. In one embodiment, the non-volatile memory array 206 may comprise a monolithic three-dimensional memory structure (3D array) in which multiple memory levels are formed above (and not in) a single substrate, such as a wafer, with no intervening substrates. The non-volatile memory array 206 may comprise any type of non-volatile memory that is monolithically formed in one or more physical levels of arrays of memory cells having an active area disposed above a silicon substrate. The non-volatile memory array 206 may be in a non-volatile solid-state drive having circuitry associated with the operation of the memory cells, whether the associated circuitry is above or within the substrate.

Word lines may comprise sections of the layers containing memory cells, disposed in layers above the substrate. Multiple word lines may be formed on single layer by means of trenches or other non-conductive isolating features.

The die controller 204 cooperates with the read/write circuits 208 to perform memory operations on memory cells of the non-volatile memory array 206, and includes a state machine 214, an address decoder 216, and a power control 218. The state machine 214 provides chip-level control of memory operations. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The address decoder 216 provides an address interface between that used by the host or a storage controller 102 to the hardware address used by the row decoder 210 and column decoder 212. The power control 218 controls the power and voltages supplied to the various control lines during memory operations. "Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like.

"Source control line" refers to a control line configured to operate a select gate (e.g., turn the select gate on, activate, and off, deactivate) for coupling a source side of a NAND string to a source line and/or another circuit.

"Source side" refers to the end of a NAND string or side of a three-dimensional memory array connected to the source layer or line on a memory die. The term comes from the source terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line. The gate terminal of each transistor may then control whether or not current flows through the transistor from source to drain, and through the string from source line to bit line.

"Source line" refers to a structure, circuit, circuitry, and/or associated logic configured to convey an electrical current and/or voltage from a supply to one or more channels of associated NAND strings. In certain embodiments, a source line is configured to convey a voltage to, and/or discharge a voltage from multiple NAND strings concurrently. In other embodiments, a source line is configured to convey a voltage to, and/or discharge a voltage from multiple NAND strings in series.

In certain embodiments, a source control line couples to one or more source-side select gates that are between the source line and one or more NAND strings and the source control line manages whether voltage or current passes between the source line and the NAND string. In such an embodiment, the source line may also be referred to as a common source line.

"Source-side select gate" refers to a select gate functioning as a switch to electrically connect a source line to a NAND string and/or a channel of a NAND string. Examples of source lines include source-side select gates, dummy word line select gates, and the like. In certain embodiments, a source-side select gate may comprise just source-side select gates (e.g., SGS0, SGS1, etc.). In other embodiments, a source-side select gate may comprise just dummy word line select gates (e.g., DWLS0, DWLS1, etc.). In still other embodiments, a source-side select gate may comprise both source-side select gates (e.g., SGS0, SGS1, etc.) and dummy word line select gates (e.g., DWLS0, DWLS1, etc.). A select gate positioned between the source line and the NAND string on the source side of the NAND string is referred to as a source-side select gate.

"Drain control line" refers to a control line configured to operate a select gate (e.g., turn the select gate on, activate, and off, deactivate) for coupling a drain side of a NAND string to a bit line and/or a sense circuit. "Drain side" refers to the end of a NAND string or side of a three-dimensional memory array connected to the bit line(s). The term comes from the drain terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line. The gate terminal of each transistor may then control whether or not current flows through the transistor from source to drain, and through the string from source line to bit line.

"Drain-side select gate" refers to a select gate functioning as a switch to electrically connect a bit line to a NAND string and/or a channel of a NAND string. A select gate positioned between the bit line and the NAND string on the drain side of the NAND string is referred to as a drain-side select gate.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The power control 218 and/or read/write circuits 208 can include drivers for word lines, source gate select (SGS) transistors, drain gate select (DGS) transistors, bit lines, substrates (in 2D memory structures), charge pumps, and source lines. In certain embodiments, the power control 218 may detect a sudden loss of power and take precautionary actions. The power control 218 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 206, can be thought of as at least one control circuit or storage controller which is configured to perform the techniques described herein. For example, a control circuit may include any one of, or a combination of, die controller 204, state machine 214, address decoder 216, column decoder 212, power control 218, sense blocks SB1, SB2, SBp, read/write circuits 208, storage controller 102, and so forth.

In one embodiment, the host 106 is a computing device (e.g., laptop, desktop, smartphone, tablet, digital camera) that includes one or more processors, one or more processor readable storage devices (RAM, ROM, FLASH memory, hard disk drive, solid state memory) that store processor readable code (e.g., software) for programming the storage controller 102 to perform the methods described herein. The host may also include additional system memory, one or more input/output interfaces and/or one or more input/output devices in communication with the one or more processors, as well as other components well known in the art.

Associated circuitry is typically involved in operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
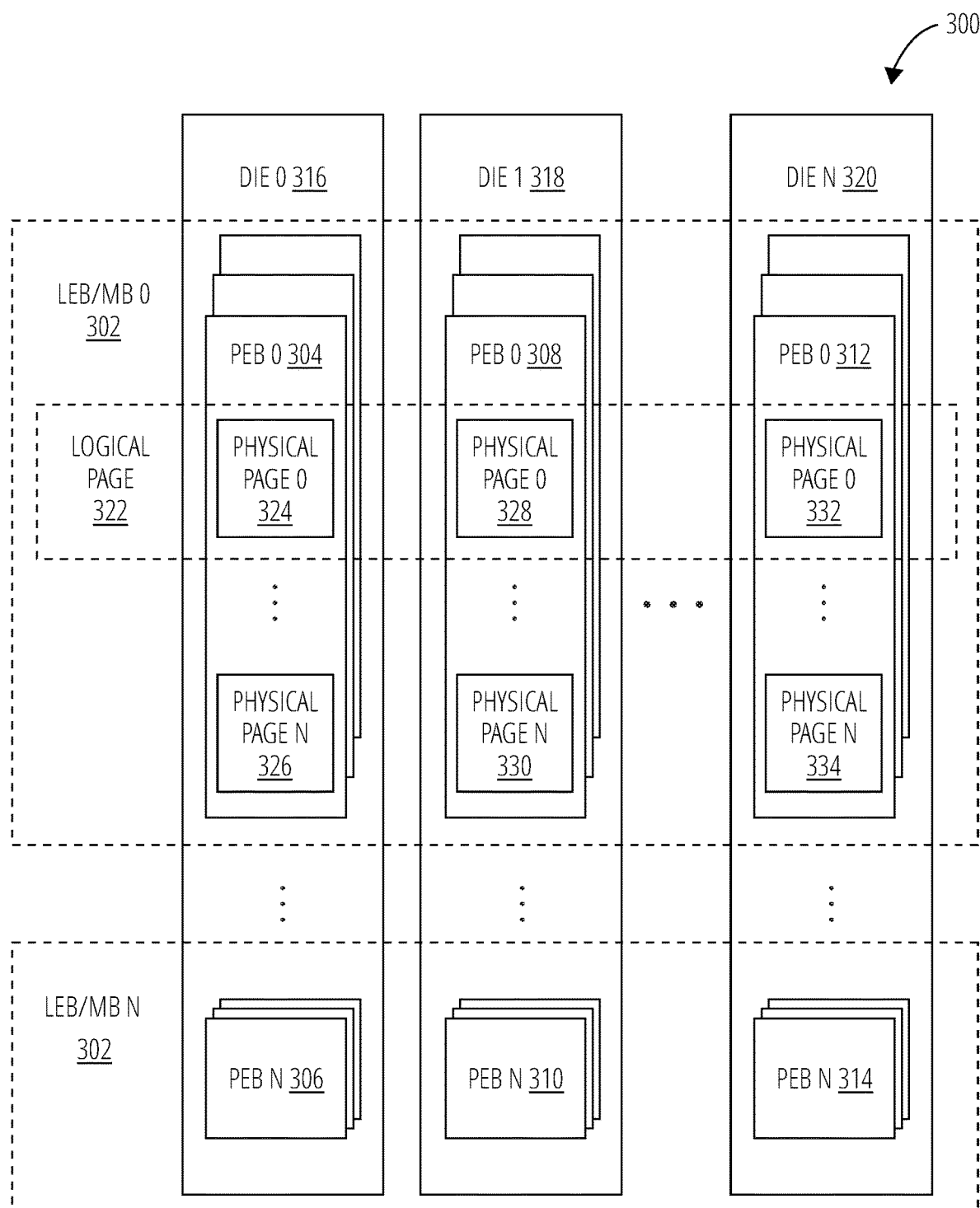
FIG. 3 illustrates a memory array 300 in accordance with one embodiment.

FIG. 3 illustrates a memory array 300 in accordance with one embodiment. In the illustrated embodiment, memory array 300 is organized into logical erase blocks (LEBs), as shown by logical erase block 302 (also referred to herein as a "metablock" or "superblock"). These LEBs include multiple physical erase blocks (PEBs) illustrated by physical erase block 0 304, physical erase block n 306, physical erase block 0 308, physical erase block n 310, physical erase block 0 312, and physical erase block n 314. "Physical erase block" refers to smallest storage unit within a given memory die that can be erased at a given time (e.g., due to the wiring of storage cells on the memory die).

The physical erase blocks may be located in separate storage dies, shown as die 0 316, die 1 318, and die n 320. In certain embodiments, a die is divided into planes. "Plane" refers to a division of a die that permits certain storage operations to be performed on both planes using certain physical row addresses and certain physical column addresses.

Those of skill in the art appreciate the relationship and differences between physical erase blocks and a logical erase blocks and may refer to one, or the other, or both by using the shorthand version erase block, block, or storage block. Those of skill in the art understand from the context of the reference to an erase block whether a physical erase block or a logical erase block (or metablock or superblock) is being referred to. The concepts and techniques used in the art and those recited in the claims can be equally applied to either physical erase blocks or logical erase blocks.

"Storage block" refers to a set of storage cells organized such that storage operations can be performed on groups of storage cells in parallel. The organization of the set of storage cells may be implemented at a physical level or a logical level. Thus, a storage block, in one embodiment, may comprise a physical page, such as a word line, a logical page comprising physical pages that span planes and/or memory die, a physical erase block comprising a set of physical pages, a logical erase block (LEB) comprising a set of logical pages, or the like. A storage block may be referred to herein as a "block", a "memory block" or an LEB.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

"Logical erase block" refers to another term for a storage block. In certain embodiments, a logical erase block refers to a set of logical pages that span planes, memory die, and/or chips. This organization of storage cells is deemed 'logical' because the physical pages may not be directly coupled to each other. However, the physical pages are operated in parallel as though they are a single page. In like manner, multiple physical erase blocks may be operated in parallel as though they are a single erase block and are thus referred to as logical erase blocks. The terms logical erase block, metablock, and super block are used interchangeably herein.

"Logical page" refers to a collection of physical page that are treated as a single page for storage operations. "Physical page" refers to physical page represents the smallest storage block within a given memory die that can be written to in a single operation.

A logical erase block such as logical erase block 302 is further divided into multiple logical pages (logical page 322) that, in turn, includes multiple physical pages, such as physical page 0 324, physical page n 326, physical page 0 328, physical page n 330, physical page 0 332, and physical page n 334. Physical pages may include multiple packets, which may be grouped into error correction code (ECC) chunks.

In one embodiment, a physical page represents the smallest storage block within a given die that can be written to at a given time. In one embodiment, a logical page is the smallest writable storage block supported by the storage controller. (in one embodiment, the storage controller may include a buffer configured to store up to a logical page worth of data; upon filling the buffer, the storage controller may write the contents of the buffer to a single logical page simultaneously.) In some instances, dividing a logical page across multiple dies may result in faster access times for a set of data when multiple dies are accessed in parallel. The logical page configurations may be mapped to any physical page on a die, or across a plurality of memory dies, just as with logical erase blocks.

In some embodiments, a storage controller 102 may associate metadata, also referred to as media characteristics, with one or more of the storage blocks (logical erase blocks, physical erase blocks, logical pages, and/or physical pages). The storage controller 102 may manage metadata that identifies logical addresses for which a logical erase block stores data, as well as the respective numbers of stored data packets for each logical erase block, data block, or sector within a logical address space. A storage controller 102 may store metadata or media characteristic data in a variety of locations, including on non-volatile storage media, in volatile memory, in a structure stored with each logical erase block, or the like.

"Media characteristic" refers to an attribute or statistic for a set of particular storage cells, such as a program/erase cycle count for the set of storage cells, a read count for the set of storage cells, a retention time since a previous write for the set of storage cells (aka a data retention time), a dwell time for the set of storage cells such as a logical or physical erase block (e.g., a time between a program of an erase block and an erase of the erase block), an average of multiple previous dwell times for the set of storage cells, an error statistic for the set of storage cells, or the like.

A media characteristic for a set of storage cells may be substantially static or may be dynamic and change over time. A media characteristic, in one embodiment, is a statistic, heuristic, mathematical model, transform, or other descriptor associated with an attribute of the non-volatile memory media.

A media characteristic, in one embodiment, includes or relates to a make, a model, a manufacturer, a product version, or the like for the storage device and/or for the non-volatile memory media. A media characteristic, in a further embodiment, may include or relate to an environmental condition or a use of the storage device and/or of the non-volatile memory media, such as a temperature, a use case (e.g., a cache use case, an archival use case, a server use case, an enterprise use case, a consumer use case, etc.), or the like.

Figure 4:
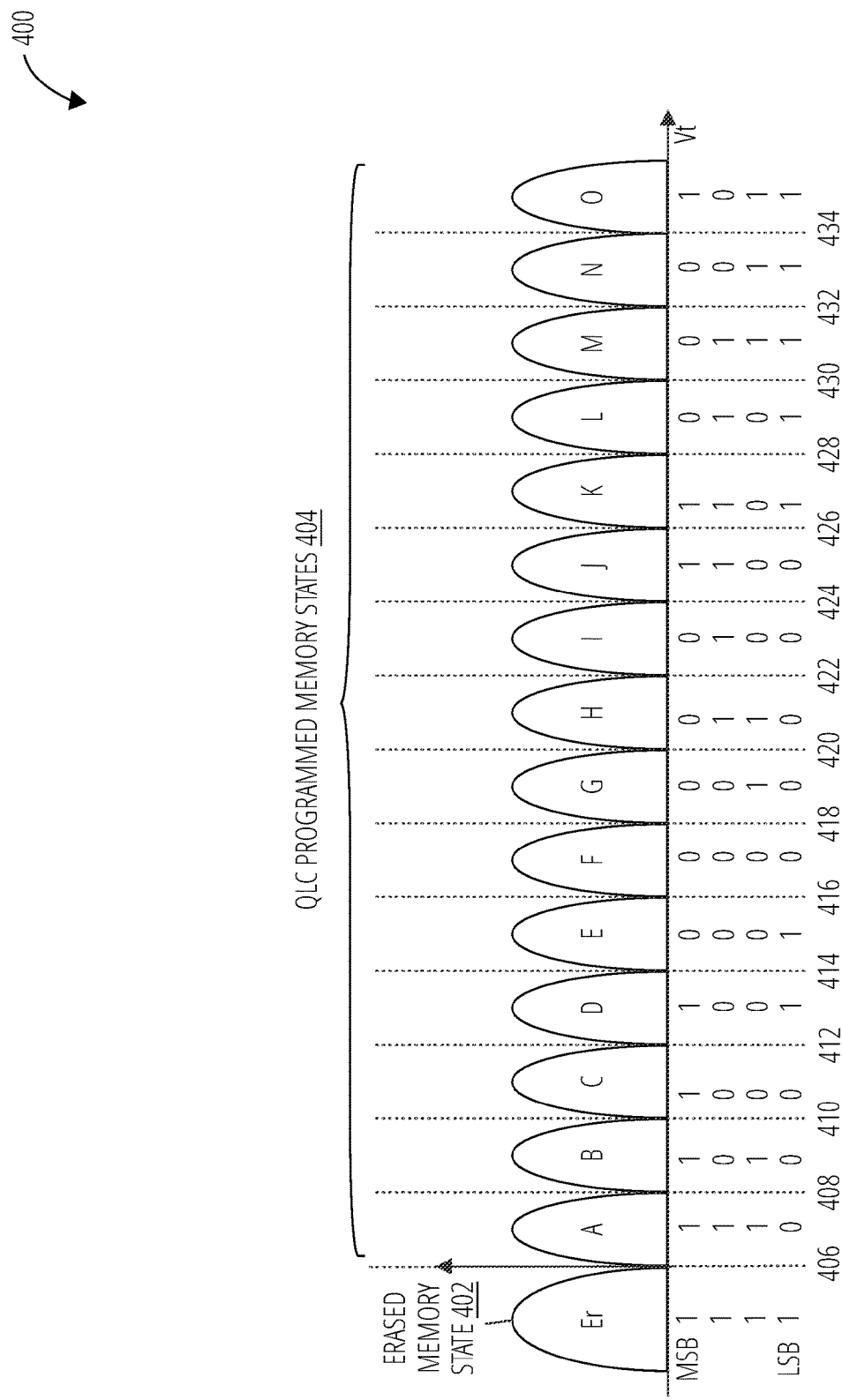
FIG. 4 illustrates cell threshold voltage distribution curves 400 in relation to one embodiment.

FIG. 4 shows a graph of a cell threshold voltage distribution for memory cells of a non-volatile storage media and cell threshold voltage distribution curves 400 such as multi-level NAND flash storage cells, or the like. The memory states, in the depicted embodiment, may be encoded using a gray code encoding model, with binary values for adjacent memory states differing by a single bit in the encoding.

"Memory state" refers to a condition, attribute, and/or characteristic, of a memory cell, or storage cell, designed and/or configured to represent an encoding for one or more data bit values. In certain embodiments, the memory state may be changed by way of a storage operation. In a non-volatile memory cell, the memory cell maintains its memory state without a power source.

In certain embodiments, and in certain contexts, memory state may also refer to a collection, or set of memory cells, that collectively have a similar condition, attribute, and/or characteristic. In relation to non-volatile memory cells, groups, collections, or sets of memory cells with a similar condition within a certain range may be referred to collectively as memory cells of a particular memory state. Furthermore, reference may be made to a memory state as a shorthand reference to all memory cells having a condition that falls within a predefined range defined for that memory state.

For example, with NAND memory cells, a threshold voltage (Vt) window may be defined between a negative threshold voltage, or approximately zero threshold voltage, and a maximum threshold voltage. Within this Vt window, a number of sub-ranges may be defined and referred to as memory states. In certain embodiments, the whole Vt window may be divided up such that each threshold voltage falls within one of the memory states. In one embodiment, each memory state has a lower boundary and an upper boundary and may be represented by a cell threshold voltage distribution.

In FIG. 4, the Vt window may begin at the low end of the erased memory state 402 ("Er") and extend to the upper end/boundary of the "O" memory state. The graph includes erased memory state 402 and memory states "A"-"O" for a total of 16 memory states to represent 4 bits stored in each memory cell. Certain memory states are adjacent memory states. "Adjacent memory state" refers to a memory state that neighbors a given memory state along a range of threshold voltages with no memory states defined between the given memory state and the adjacent memory state. "Er" memory state (erased memory state 402) and "A" memory state are adjacent memory states. Similarly, "A" memory state and "B" memory state are adjacent memory states. "A" memory state and "C" memory state are not adjacent memory states because "B" memory state is between them.

The graph illustrates a threshold voltage for memory cells of a non-volatile storage media along the x-axis. The y-axis identifies a number, or count, of memory cells sensed/detected/read that have the corresponding threshold voltage along the x-axis. The curves within each memory state represent a normal distribution of memory cells that fall within a given memory state. Taken together the curves of the graph illustrate a cell threshold voltage distribution. In certain embodiments, a curve representing memory cells within a particular memory state may also be referred to as a cell threshold voltage distribution. Thus, a cell threshold voltage distribution for non-volatile storage media may include a number of cell threshold voltage distributions.

"Cell threshold voltage distribution" refers to a process or method for determining a threshold voltage for each memory cell in a set of memory cells. Cell threshold voltage distribution may be referred to as cell voltage distribution and may be referred to using the acronym "CVD."

A cell threshold voltage distribution may be determined during research and development of non-volatile memory technology to understand how memory cells behave under different conditions. In certain embodiments, a cell threshold voltage distribution may be performed during operation of non-volatile memory to determine whether the read levels being used to read a memory cell are adequate. If a bit error rate for a first set of read levels is inadequate, countermeasures may be taken to reduce the bit error rate.

In certain embodiment, these countermeasures may include adjusting configuration parameters such that a bit error rate decreases. In certain embodiments, the steps of determining a cell threshold voltage distribution, checking read levels and other media characteristics with respect to bit error rate, and taking any countermeasures, may be referred to as a CVD scan, a read scan, or a read scan operation. A CVD scan may require significant time to complete due to the various steps involved and the number of memory cells being scanned. In particular, where memory cells store four or more bits per memory cell, a CVD scan may incur high latency, unless aspects of the claimed solution are used. "Bit error rate" refers to a measure of a number of bits in error of a total overall number of bits processed. Depending on the use case, a bit error rate may be calculated either before, or after, an Error Correction Code (ECC) decoder has made one or more attempts to correct one or more bits in error.

"Configuration parameter" refers to a parameter of a set of storage cells that is modifiable by way of an interface, such as a read threshold, a write or program threshold, an erase threshold, or the like. An interface for modifying a configuration parameter may include a programmable data register, a command interface of a control bus for the non-volatile memory array, an API of a device driver of the storage device, a control parameter for the storage controller, or the like.

The threshold voltage for each memory cell may be encoded to represent binary data. In particular, the threshold voltage for each memory cell may be encoded to represent a 2, 3, 4 or more bits per memory cell. For example in FIG. 4, the binary value "1111" may in one embodiment be associated with the lowest memory state (labeled Er, an erased memory state 402), the value "1110" associated with the next lowest read voltage state and first of the QLC programmed memory states 404 (labeled A), the value "1010" associated with the next highest read voltage state (labeled B), and the value "1000" associated with the next highest read voltage state (labeled C), and so on, with only one bit changing between memory states, also referred to as read voltage states.

In FIG. 4, the lowest memory state Er is depicted as a negative threshold voltage below the depicted 0.0V. In other embodiments, the lowest memory state Er may comprise a positive threshold voltage above the 0.0V level, or span the 0.0V level. Values, magnitudes, sizes, and the like of read voltages may vary by manufacturer and type of non-volatile memory cell, each of which are encompassed by this disclosure. A read level is used by the die controller to distinguish memory cells in one memory state from those in another.

"Read level" refers to a voltage level configured to test, check, read, or sense, which memory cells conduct at the voltage level. In certain embodiments, the memory cells may comprise transistors and the read level, or read voltage, is a voltage level at, or above a threshold voltage for the memory cells which causes the memory cell to conduct a current, to activate.

In certain embodiments, depending on the type of encoding used to store data on the memory cell and the number of bits encoded on each memory cell, a single read/sense operation using a single read voltage may be determinative of the memory state of the memory cell. In other embodiments, a number of read/sense operations each performed at different read voltage levels may be used to determine the memory state of the memory cell.

The determined memory state may then be decoded into a representation of the data bits stored by the memory cell. "Read voltage" is a shorthand reference to a "read threshold voltage." "Read level" is another term commonly used to describe a "read voltage" and the two terms are used interchangeably herein. Reading memory cells based on a read level may be used for reading stored data in the memory cells as well as testing/checking performance of the memory cells and determining whether to make any changes to configuration parameters for the memory cells.

FIG. 4 illustrates multiple default read levels which may be set at the time a storage device 200 is manufactured and may be tuned during a manufacturing process and/or later when the storage device 200 is in use by a customer. When memory cells are programmed, the threshold voltages are changed from the erased memory state 402 to one of the QLC programmed memory states 404. Each memory state is bounded by a default read level. If a programmed, operational, memory cell does not activate at a default read level, the threshold voltage of the memory cell is above the default read level. The read or sense storage operation is an iterative process. And completing the iterative process, either for reading data or for sensing all memory cells, such as with CVD, identifies each memory cell as a member of one of the erased memory state 402 or QLC programmed memory states 404.

Read level A 406, read level B 408, read level C 410, read level D 412, read level E 414, read level F 416, read level G 418, read level H 420, read level I 422, read level J 424, read level K 426, read level L 428, read level M 430, read level N 432, and read level O 434 in the depicted embodiment, may comprise default read levels that separate memory states A from Er, B from A, C from B, etc., respectively. While default read levels may be set at the time of manufacture, they may be adjusted, as needed to ensure optimal performance of the memory cells. In certain embodiments, a default read level represents a current read level for a memory cell. "Current read level" refers to a read level that is a value that is presently being used by a die controller or storage controller for read operations on memory cells. In certain embodiments, a current read level may be a default read level that has been used for prior read operations. In another embodiment, the current read level may comprise a read level set by a prior read scan operation and which may be changed in a presently executing read scan operation.

A program storage operation changes a media characteristic, e.g., threshold voltage, of the memory cells to a different state to represent a programmed condition. By setting the media characteristic to one of a plurality of different states according to a particular encoding, multiple bits may be stored in a single memory cell. With NAND memory cells, the program operation changes the threshold voltage to a threshold voltage between two read levels. For example, in one embodiment, a program operation may program certain memory cells to an H memory state by changing the threshold voltage to a level between read level H 420 and read level I 422. In certain embodiments, additional thresholds may be used, including a programming level, a program verify level, and the like.

Figure 6:
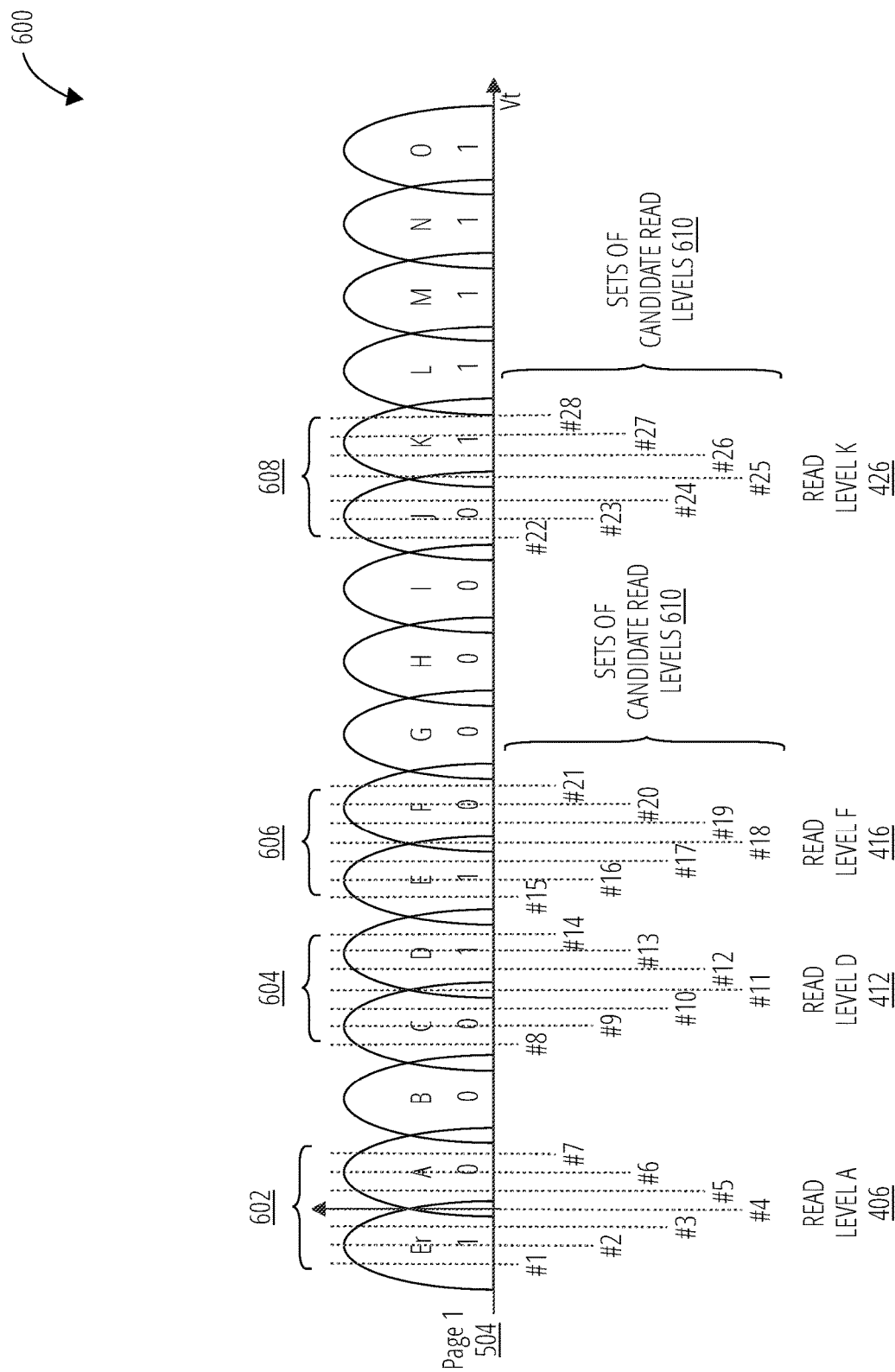
FIG. 6 illustrates example read scan operation(s) 600.

Based on a data encoding, a non-volatile memory storage controller may interpret discrete threshold voltages for a quad-level storage cell as representing four binary bits. FIG. 4 and FIG. 5 illustrate an embodiment that uses a Gray code encoding. Other programming and encoding models may be used, and certain non-volatile memory media may have more or fewer possible states, allowing other amounts of data to be stored in a single storage cell. The memory states A through O may or may not be contiguous; for example, in certain embodiments, the voltage levels may be separated by band gaps known as guard bands. For example, A and B may be separated by 0.3V. The memory states A through O may alternately exhibit overlap as illustrated in FIG. 6.

Referring now to FIG. 4 and FIG. 5, FIG. 4 illustrates cell threshold voltage distribution curves 400. The illustrated voltage distribution curves are for memory cells programmed to store four bits of data. At a given point in time, each memory cell may be in one of a plurality of memory states (also referred to as data states). The memory states may include an erased state and a plurality of programmed states. The number of programmed states corresponds to the number of bits the memory cells are programmed to store.

A memory cell programmed to store four bits may be in an erased state 402 or one of fifteen programmed states A-O. Each cell threshold voltage distribution curve (within states Er-O) is associated with the erased state or one of the programmed states. Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage VTH a memory cell has enables the data (i.e., the logic values of the bits) that the memory cell is storing to be determined.

The specific relationship between the data programmed into the memory cells and the threshold voltage levels of the memory cell depends on the data encoding scheme used for programming the memory cells. In one example, a gray code scheme may be used to assign data values to the threshold voltage distribution curves. "Gray code encoding" refers to a type of encoding scheme based on a numbering system that assigns a certain bit values to a range of threshold voltages that a memory cell may have. The bit values are assigned such that the bit pattern differs between adjacent threshold voltage ranges by only one bit. Such a bit pattern assignment is advantageous because while a threshold voltage may change, drift, from one range to a neighboring range, unintended change or drift is likely not enough to cause a two bit change in the encoding. In this manner, undesired drift can be detected and accommodated.

In one example, the range of threshold voltages may be one of a plurality of threshold voltage ranges that may be used to encode multiple bits of data into a memory cell. For example, suppose a memory cell is configured to store two bits of information, and the successive ranges of threshold voltages are between a negative lower bound threshold voltage and positive upper bound threshold, e.g., about 5 volts. If four ranges are defined the lower most range may have a bit assignment of '00', the next highest a bit assignment of '01', the next highest a bit assignment of '10', and the last range a bit assignment of '10'.

Of course, memory cells that store multiple bits of data may use a gray code encoding or another encoding process, such as those described in US patents: U.S. Pat. No. 6,222,762 and/or U.S. Pat. No. 7,237,074 which are included herein by reference, for all purposes.

FIG. 4 illustrates how one example of a gray code encoding maps to the memory states. Below each memory state is a binary value of 4 bits listed from the most significant bit (MSB) reading down to the least significant bit (LSB). FIG. 5 illustrates the same encoding mapping in a table form. A page of data, logical or physical is associated with each position in the binary value. In other words, reading all MSB bits of memory cells along a physical word line, a physical page, or groups of physical pages along a row of the non-volatile memory array forms a logical page.

In one embodiment, the LSB corresponds to a lower most page of data and the MSB corresponds to an upper most page of data, with the other two bits representing intermediate level pages of data. In certain embodiments, a multi-level storage cell may adhere to a multi-phase programming model, which includes writing the LSB before the intervening bits and MSB can be written or vice versa. In another embodiment, the LSB, intervening bits, and MSB may be programmed separately by the storage controller. Such an approach may be taken due to vendor or manufacturer requirements for page pairing (e.g., an LSB bit of MLC cell is paired with an MSB bit of a different MLC cell) and page addressing (e.g., LSB page is be programmed before the MSB page or vice versa). In certain instances, the LSB is written before the MSB is written, the MSB is written before the LSB is written, or the like.

FIG. 5 illustrates example encoding for multi-level storage cells 500. Using a gray code encoding enables a logical page to be read with fewer read operations because the encoding ensures that only on bit changes between adjacent memory states. For example, the erased state Er may be represented by "1111" and may transition to memory state A to represent "1110", in which the bit that changed is the least significant bit. FIG. 5 illustrates four pages Page 1 504, Page 2 506, Page 3 508, and Page 4 510. Each page may be read one at a time. For example, Page 1 504 may be read, then Page 2 506, etc., and four page reads may thus be needed to determine which of the QLC memory states 502 is represented at a particular memory cell.

Due to the gray code encoding, bits stored in a cell may be determined by reading at the locations where bits may change between memory states. For example to read Page 1 504, read operations at read level A 406, read level D 412, read level F 416, and read level K 426 are a sufficient number of reads to decode the data values for Page 1 504 without reading at each default read level.

FIG. 6 illustrates example read scan operation(s) 600 on memory cells programmed to one of sixteen possible memory states, e.g., Er-O. A read scan operation may adjust read levels from a default read level to a new read level in order to reduce a number of errors when reading the memory cells.

"Read scan operation" refers to a maintenance operation performed to identify and mitigate or avoid or counter errors in the data or storage cells and/or other components of a non-volatile storage device. A read scan operation may be referred to, interchangeably, as a "read scan" or "read scan operation." In one embodiment, a read scan operation involves reading data from, or sensing a determinable physical characteristic, or a memory state of storage cells in a storage block. Next, the read scan operation checks the memory states of the storage cells for any errors, corrects as many errors as possible, and determines a bit error rate. Then, the read scan operation determines if the bit error rate satisfies a threshold such as a read bit error rate threshold.

In one embodiment, the read scan operation reads data from each logical page, or word line, of the storage block. In another embodiment, the read scan operation selects less than all of the logical pages of the storage block. In other words, the read scan operation may sample the logical pages of the storage block from which to read data for the read scan operation.

If a read bit error rate threshold is satisfied, the read scan operation then may perform a data scrub operation or a data refresh operation. In certain embodiments, a read scan operation may always include a data scrub operation or a data refresh operation. In other embodiments, performing a data scrub operation or data refresh operation may be conditioned on the bit error rate satisfying a read bit error rate threshold. In such embodiments, a read scan operation may be referred to as a "read scrub" or "read scrub operation." In these embodiments, a read scan operation may conditionally include a data scrub operation.

In certain embodiments, a read scan operation may operate as a foreground process meaning that the read scan operation interrupts, or delays, a non-volatile storage device from servicing read commands or write commands for a host. In addition, the read scan operation may need to complete working on a particular storage block and thereby delay a host read command for data on that particular storage block. Thus, in such embodiments, a read scan operation may impact quality of service levels between a host and the non-volatile storage device.

A read scan operation may use a variety of techniques and/or methods to adjust read levels. Certain of the techniques or methods may iteratively use different candidate read levels in order to determine a replacement read level for a current read level. Furthermore, a read scan operation may be implemented in a storage controller, die controller, host 106, or combination of these.

"Candidate read level" refers to a value, setting, configuration, numeric value, offset, or the like for a read level that may provide more accurate sensing of memory cells and/or reading of data from memory cells than a current read level. In certain embodiments, candidate read levels may be predetermined, and may be stored in a repository such as a data structure. In other embodiments, candidate read levels may be predetermined and may be organized into a predefined order which a read scan circuit may be configured to follow in selecting candidate read levels to use in determining a read level to replace a current read level.

In still other embodiments, candidate read levels may be calculated based on results of one or more prior sense, and/or read operations (referred to herein as a "scan" or "scans"), that a read scan circuit may perform on a set of storage cells. For example, in one embodiment, the read scan circuit may compare results of a prior scan to results for a current scan using a current candidate read level. If the results with the current candidate read level are more favorable, the read scan circuit may calculate a next candidate read level based on the current candidate read level. If the results with the current candidate read level are less favorable, the read scan circuit may calculate a next candidate read level based on one or more prior scans using candidate read levels. In embodiments that determine which candidate read levels to use with successive iterations, a read scan circuit may apply a positive or negative offset to a current read level to determine a next candidate read level.

A candidate read level may comprise one of a plurality of read levels positioned generally between a majority of memory cells of cell threshold voltage distributions for two adjacent memory states. It is desirable that candidate read levels result in optimal performance when reading data from memory cells programmed to one of the two adjacent memory states.

In one embodiment, at least one of the candidate read levels will produce an optimal result, result in the fewest number of bit errors when reading from one of the adjacent memory states. Such candidate read levels may be referred to as a target read level. A target read level is a read level that results in a smallest or fewest number of activated memory cells in relation to other candidate read levels that may be iteratively checked. In another embodiment, the target read level is a read level that results in a smallest or fewest number of bit errors or bit error rate or estimated bit error rate from a read set of memory cells in relation to other candidate read levels that may be iteratively checked.

Valley Search Operation

One method a read scan operation may use is referred to as a valley search operation. "Valley search operation" refers to is a type of read scan operation configured to iteratively test or check a number of candidate read levels around a boundary for a set of memory cells within cell threshold voltage distributions for two adjacent memory states. In certain embodiments, the valley search operation may begin with a current read level or a default read level which may have been set when a storage device is manufactured. Next the valley search operation may apply a candidate read level to determine if the candidate read level resulted in fewer memory cells activating than the current read level. If so, this means that more memory cells will be identified as being programmed to a correct memory state. If not, this means that more memory cells will be erroneously identified as being to one of the adjacent memory states. The valley search operation continues to iterate in this manner changing the candidate read level with each iteration until a read level is identified that results in the fewest number set of memory cells being activated and/or a fewest number of read errors (e.g., lower bit error rate). In this manner, the valley search operation seeks a target candidate read level that provides an optimal read result. The valley search operation gets its name from the iterative process of testing candidate read levels until one is located that aligns with a "valley" between cell threshold voltage distribution curves for two adjacent memory states.

In one embodiment, a valley search operation may be conducted to adjust read levels for a lowest logical page, Page 1 504, and/or for sets of adjacent memory states for each logical page. Details for a valley search operation for Page 1 504 are illustrated to provide an example.

The binary values for memory cells storing data of Page 1 504 are illustrated below the curves. As these values indicate and the gray code encoding shows four read operation are needed to read Page 1 504. In one embodiment, a valley search operation may check, and optionally adjust, each of the four read levels. Each read level may be associated with a read level window.

"Read level window" refers to a set of candidate read levels that may serve as a read level between two adjacent memory states. In certain embodiments, where the memory cells that are read a read using one or more threshold voltages, a read level window may comprise a set of threshold voltages between a low threshold voltage and a high threshold voltage, with each member of the set of candidate read levels within the read level window comprising a distinct threshold voltage.

In another embodiment comprise NAND memory cells, a read level window may comprise a set of threshold voltages between a low threshold voltage and a high threshold voltage, with each member of the set of candidate read levels within the read level window comprising a threshold voltage offset by one or more offset amounts from a default read level, such as a current read level. The offsets from the default read level may be both greater than and/or less than the default read level. A read level window may also be referred to as a "scanning" window.

FIG. 6 includes read level window 602, read level window 604, read level window 606, and read level window 608, one for each read level A 406, read level D 412, read level F 416, and read level K 426, respectively. For each read level window, scanning window, a set of sets of candidate read levels 610 may be used. For example, threshold voltage levels #1-#7 may be the candidate read levels used across read level window 602 to determine an optimal placement for read level A 406, levels #8-14 for read level D 1110, levels #15-21 for read level F 416, and levels #22-28 for read level K 1114.

By way of example, a valley search operation may iteratively determine an optimal read level for each of read level A 406, read level D 412, read level F 416, and read level K 426. For read level A 406, suppose the default read level is candidate read level #5 and memory state Er has moved up, shifted to the right and memory state A has shifted to the left, moved down. After determining how many memory cells candidate read level #5 activates (or alternatively how many bit errors are in a code word when read level A 406 is a candidate read level #5), the valley search operation may next check a next highest candidate read level #6 or check a next lowest candidate read level #4.

With each iterative check, the valley search operation compares a result (e.g., number of activated memory cells or bit error rate) with a prior result for a previous check. If the candidate read level being checked/tested results in higher bit errors or more activated memory cells, the valley search operation may check a threshold voltage in an opposite direction than the direction that lead to the higher bit errors (activated memory cells). So, if the candidate read level #5 results in fewer activated memory cells than candidate read level #6, then the valley search operation may next test candidate read level #4. If the candidate read level #4 results in fewer activated memory cells than candidate read level #5, then the valley search operation may next test candidate read level #3. If the candidate read level #3 results in more activated memory cells than candidate read level #4, then the valley search operation may stop iterating and determine that candidate read level #4 is the "valley" between the Er memory state and A memory state. Consequently, the valley search operation may change a default read level from candidate read level #5 to candidate read level #4. Next, the valley search operation may follow this similar process for read level D 412, read level F 416, and read level K 426. For example, candidate read levels from read level window 604, read level window 606, and read level window 608 may be iteratively tested. Furthermore, of a valley search operation is done for all logical pages, eventually, all the read levels of the Vt window will be tested and potentially changed to obtain optimal read operation results. A valley search operation is an iterative trial and error method for determining how to adjust read levels.

The candidate read levels, for example of read level window 602, may be predefined. In another example, the valley search operation derives the candidate read levels by applying an offset for a last candidate read level.

Bit Error Rate Estimation (BES)

Another read scan operation that may be used is referred to as a Bit Error Rate Estimation (BES) method. "Bit error rate" refers to a measure of a number of bits in error of a total overall number of bits processed. Depending on the use case, a bit error rate may be calculated either before, or after, an Error Correction Code (ECC) decoder has made one or more attempts to correct one or more bits in error.

Like a valley search operation, a BES read scan operation is an iterative trial and error method that seeks to determine an optimal read level for one or more read levels. Similarly, to set read levels for Page 1 504, a BES read scan operation may check read level A 406, read level D 412, read level F 416, and read level K 426. However, a BES read scan operation may be optimized to determine a most likely optimal candidate read level for each read level and as the BES read scan operation tests for one read level, an emulator may determine the results of scanning Page 1 504 with the other read levels set a certain starting levels. In one embodiment, the scanning may be different from reading because threshold voltages determined are emulated and data from memory cells is not actually read, in the normal sense. Use of aspects of the disclosed solution may enable a BES read scan operation to read at the read levels but perform fewer emulated threshold voltage determinations in the scanning part of the BES read scan operation. In this manner, the BES read scan operation seeks to limit a number of iterations of read/sense operations performed on the memory cells to determine optimal read levels.

BES read scan operations may start with all read levels at a predetermined starting point and take sensed measurements for different candidate read levels for a first read level. For example, a BES-based scan may begin at #4 for read level A 406, then iterate in a predefined order (#3, then #5, then #6, then #2, etc.) through the candidate read levels of read level window 602 while keeping other read levels (read level D 1110, read level F 416, and read level K 1114) in the same position. "Predefined order" refers to a sequence of steps, operations, selections, functions, determination, or actions in an order that is defined before an operation that follows the predefined order is initiated.

These other read levels may be emulated rather than sensed. When a minimum (fewest number of memory cells activated or fewest number of bit errors) has been indicated among the first set of sets of candidate read levels 610, determining read level A 406, the next set of candidate read levels for a next read level may be analyzed. In certain instances, minimum here relates to a minimum number of check nodes (syndrome weights), which may be used as an estimate of BER based on different hypotheses related to the number of senses performed. To obtain syndrome weights, a BES read scan operation may read and decode data using a decoder, and this process may take significant time.

When the syndrome weights are below a threshold, the relative value of a syndrome weights is a suitable proxy or indicator for a bit error rate. In this manner, the BES read scan operation leverages an estimated bit error rate. "Estimated bit error rate" refers to a value that directly, indirectly, and/or approximately represents a bit error rate for a certain set of data bits stored in one or more memory cells. Advantageously, an estimated bit error rate serves as a suitable proxy for a calculated bit error rate and may be obtained with fewer computing cycles and in a faster time than time needed to determine a bit error rate.

One example of an estimated bit error rate is a rate resulting from a Bit Error Rate (BER) Estimation Scan (BES) operation. A BES read scan operation is a type of read scan operation in with candidate read levels for certain read levels for a logical page a tested in a predefined order. In one embodiment, the BES read scan operation tests a particular candidate read level and an algorithm determines results for simulated/emulated testing of other read levels for a particular logical page.

A BES read scan operation, in one embodiment, may determine an estimated bit error rate by comparing syndrome weights between iterative read level sensing or read operations to determine which candidate read level results in the fewest number of activated memory cells. In such embodiments, a syndrome weight below a threshold serves as a proxy for a bit error rate, an estimated bit error rate. A syndrome weight is a number of unsatisfied ECC parity check equations nodes/equations from a Low-Density Parity-Check (LDPC) error correction code decoder (ECC decoder).

In a Low-Density Parity-Check (LDPC) ECC decoder, a syndrome weight for a codeword is a number of unresolved equations, or unsatisfied check nodes, when the codeword is decoded. On average, the greater the number of unsatisfied check nodes (higher syndrome weight) the higher the number of errors in the codeword. On average, the fewer the number of unsatisfied check nodes (higher syndrome weight) the lower the number of errors in the codeword. Thus, in certain instances, a codeword with fewer errors may still have a greater the number of unsatisfied check nodes (higher syndrome weight).

In addition, a BES read scan operation may test candidate read levels in a predefined order. For example, when checking for read level D 412, the predefined order of candidate read levels may be #10, then #13, then #14, then #8, then #9. This predefined order may be determined by a manufacturer based on a series of tests and research and development to understand which candidate read levels are most likely to result in the lowest bit error rate after the fewest number of iterations within the BES read scan operation.

Figure 7:
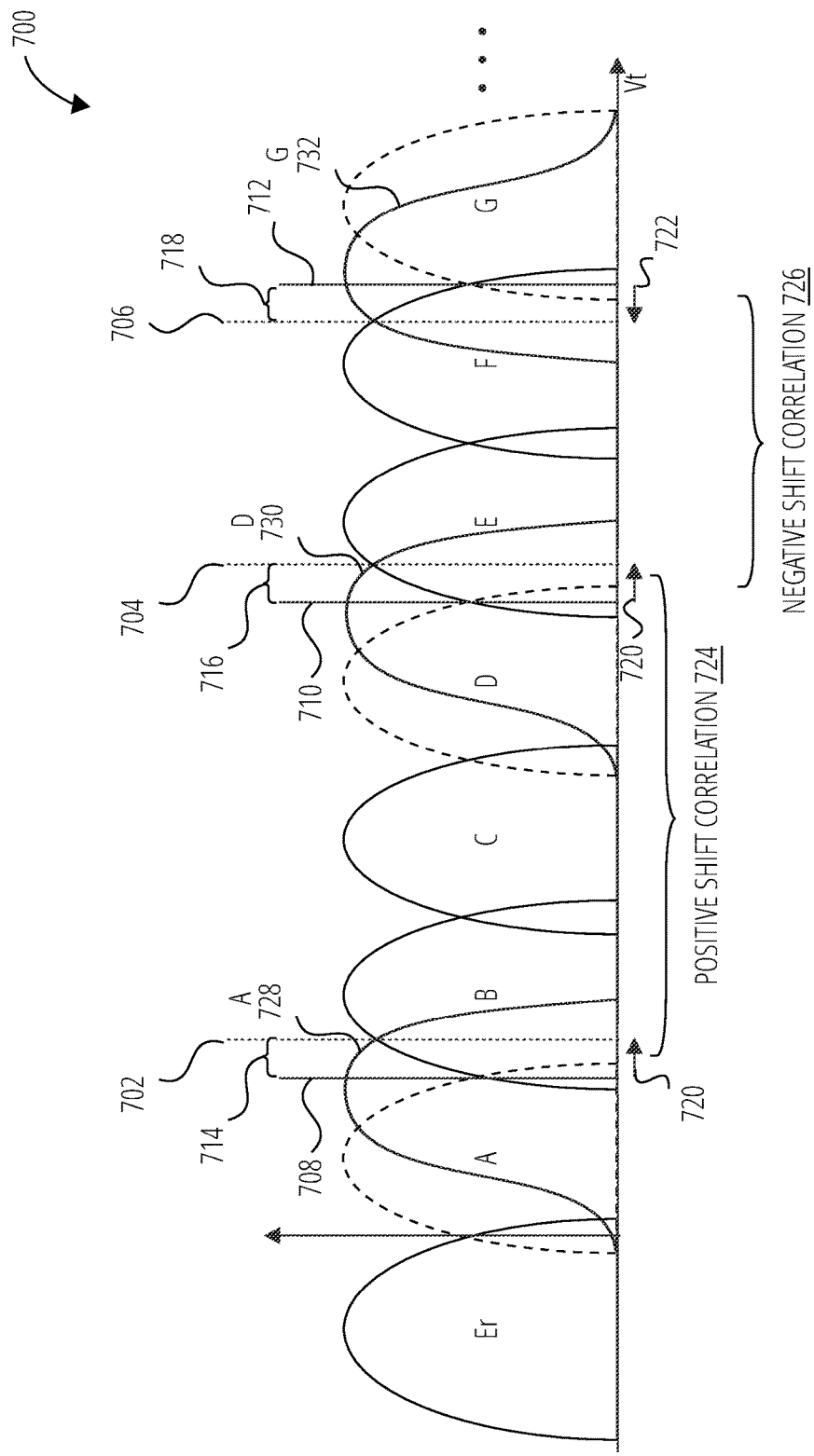
FIG. 7 illustrates correlations between memory states 700 in accordance with one embodiment.

There are various other aspects to the BES read scan operation which are not discusses in detail here. Instead, suitable implementations of a BES read scan operation for use with aspects of the disclosed solution are described in U.S. Pat. No. 9,697,905 filed Dec. 4, 2014, issued Jul. 4, 2017, which is hereby incorporated by reference for all purposes FIG. 7 depicts an example of correlations between memory states 700 and adjustments to read levels for a set of multi-level storage cells of non-volatile memory media. Those of skill in the art recognize that threshold voltages for memory cells change over time due to various factors, including temperature changes, wearing of the memory cells, disturb influences, leakage, and the like. Generally, such changes are not problematic for a majority of the memory cells within a cell threshold voltage distribution. However, these changes in threshold voltage may result in higher bit error rates due to memory cells near the boundaries of the memory states (such boundaries may be referred to a lower tail for a part of the distribution curve closest to the lowest threshold voltages and an upper tail a part of the distribution curve closest to the higher threshold voltages) moving from having a threshold voltage within one memory state to having a threshold voltage within a neighboring memory state (adjacent memory state).

To address these changes, the read scan operation adjusts the read levels at the cell threshold voltage distribution curve boundaries. FIG. 7 illustrates a few example memory states in which the read level adjustment has been made. Curves illustrated in solid lines represent a current distribution and those illustrated in dashed lines represent what the cell threshold voltage distribution was in the past.

In the example illustrated, adjustments to create adjusted read level B 702, adjusted read level E 704, and adjusted read level G 706 have been made. The previous read levels are also indicated as previous read level B 708, previous read level E 710, and previous read level G 712. The read scan operation, in one embodiment, determines different adjustments to the previous read levels, resulting in the adjusted read levels. In the depicted embodiment, the read scan operation may determine adjustment 714, adjustment 716, and adjustment 718 individually for the different memory states B, E, and G, with different magnitudes, different directions, and the like, customizing the different adjustment levels, adjusted read level B 702, adjusted read level E 704, and adjusted read level G 706 individually to media characteristics of the different memory states B, E, and G. Each memory state Er, A, B, C, etc., through O as illustrated in FIG. 4 may receive this treatment. A subset of the memory states, Er through G, are illustrated here for convenience.

The adjusted read levels align with the changed cell threshold voltage distributions. Were previous read levels, such as previous read level B 708, previous read level E 710, previous read level G 712 used, the memory cells near the boundaries would register data errors. Similarly, because the charge levels of the different memory states A, D, and G have drifted, leaked, been disturbed, or the like by different amounts, and/or in different directions, using the same adjustment for each memory state B, E, and G, in certain embodiments, may register data errors. By configuring the corresponding set of storage cells to use the individually adjusted read levels, the read scan operation may prevent, avoid, or correct potential data errors. In one embodiment, the read scan operation determines the adjusted read levels, adjusted read level B 702, adjusted read level E 704, and adjusted read level G 706, reactively, after a bit error rate crosses a threshold. In another embodiment, the read scan operation determines the adjusted read levels proactively based on operating conditions and media characteristics for a corresponding set of memory cells.

As is illustrated here, an increasing threshold voltage shift 720 of memory state A may necessitate adjustment 714 resulting in an adjusted read level B 702 (wherein read level B demarcates the transition between memory state A and memory state B). Similarly, an increasing threshold voltage shift 720 of memory state D may necessitate adjustment 716 to adjusted read level E 704. A decreasing threshold voltage shift 722 to memory state G, on the other hand, may necessitate adjustment 718 to adjusted read level G 706, based on the illustrated example in FIG. 7.

One may observe that the increasing threshold voltage shift 720 of memory state A 728 is frequently accompanied by an increasing threshold voltage shift 720 of memory state D 730. These shifts are one example of a correlation. "Correlation" refers to a relation existing between phenomena, attributes, behaviors, or things or between mathematical or statistical variables which tend to vary, be associated, or occur together in a way not expected on the basis of chance alone. ("Correlation." *Merriam-Webster.com Dictionary*, Merriam-Webster, Accessed 10 Apr. 2020. Edited.)

A relation/correlation may be represented in a variety of ways, including by use of numbers, formulas, graphs, diagrams or the like. In certain embodiments, the correlation may represent a one-way relationship between a first thing and a second thing, meaning the correlation exists from the first thing to the second thing but not from the second thing to the first thing. In other embodiments, the correlation may represent a two-way relationship between a first thing and a second thing, meaning that the same correlation exists in comparing the first thing to the second thing and from the second thing to the first thing.

In certain embodiments, the correlation represents a magnitude and/or rate of change in an attribute or behavior between two or more things. Correlations may be observed, or derived, by testing and analysis of results from normal use, experiments, machine learning, or the like. Correlations between two things, such as memory cells, threshold voltages, memory die, memory states, cell threshold voltage distributions, or the like, may be characterized as positive correlations or negative correlations.

Specifically, because the increasing threshold voltage shift 720 of memory state A occurs in the same direction as the increasing threshold voltage shift 720 of memory state D, the correlation between them is referred to as a positive shift correlation 724. "Positive correlation" refers to a correlation in which two or more correlated things respond in the same manner to a particular influence, environment, action, or stimuli. For example, where threshold voltages of memory cells are represented by cell threshold voltage distributions and the cell threshold voltage distributions are mapped to memory states, memory cells within a first memory state are positively correlated to memory cells within a second memory state when the correlated attribute changes in the same direction for the memory cells of the first memory state and the memory cells of the second memory state.

Said another way, if the correlated attribute increases for the memory cells of the first memory state and the correlated attribute increases for the memory cells of the second memory state, this is a positive correlation. In certain embodiments, the correlated attribute may comprise a threshold voltage, or change in a cell threshold voltage distribution for a set of memory cells in a memory state.

One may observe that an increasing threshold voltage shift 720 of memory state D 730 is often accompanied by a decreasing threshold voltage shift 722 of memory state G 732. This relationship is another example of a correlation. Because the increasing threshold voltage shift 720 in memory state D 730 and the decreasing threshold voltage shift 722 in memory state G 732 occur in opposite directions, this correlation is referred to as a negative shift correlation 726. "Negative correlation" refers to a correlation in which two or more correlated things respond in an opposite manner to a particular influence, environment, action, or stimuli. For example, where threshold voltages of memory cells are represented by cell threshold voltage distributions and the cell threshold voltage distributions are mapped to memory states, memory cells within a first memory state are negatively correlated to memory cells within a second memory state when the correlated attribute changes in the opposite direction for the memory cells of the first memory state and the memory cells of the second memory state.

Said another way, if the correlated attribute increases for the memory cells of the first memory state and the correlated attribute decreases for the memory cells of the second memory state, this is a negative correlation. In certain embodiments, the correlated attribute may comprise a threshold voltage, or change in a cell threshold voltage distribution for a set of memory cells in memory states.

Positive shift correlation 724 and Negative shift correlation 726 are both examples of shift correlations. "Shift correlation" refers to a correlation in which memory cells of a cell threshold voltage distribution within a first memory state change or shift in threshold voltage (either increasing or decreasing) in response to passage of time, or use of a storage device, in a manner that correlates to a change or shift in threshold voltage (either increasing or decreasing) for memory cells of a cell threshold voltage distribution within a second memory state. A shift correlation may exist between any two memory states used for a set of memory cells.

In certain embodiments, the correlation may be represented by a magnitude and/or rate of change in an attribute or behavior between two or more things. The size of a value representing a correlation may directly relate to the strength or weakness of the correlation. Similarly, positive correlations may be represented by positive values for a correlation and negative correlations may be represented by negative values for a correlation. In one embodiment, a correlation is represented by a correlation factor. "Correlation factor" refers to a value that modifies a correlated attribute when the correlated attribute is multiplied by the correlation factor such that the correlated attribute accounts for a correlation associated with the correlation factor. For example, in one embodiment, the correlated attribute may be a read level. Each read level may mark a boundary between two adjacent memory states.

A correlation factor may represent how one memory state relates to another memory state such that multiplying the correlation factor by a current read level results in a correlated read level modified to account for the correlation. A correlation factor may be a real number and may be a positive number reflecting a positive correlation, a negative number reflecting a negative correlation, a zero representing no correlation, or a 1 representing a complete correlation. Correlation factors may be helpful in modifying a value to reflect a correlation. For example, in one embodiment, the value may be multiplied by a correlation factor such that the value then accounts for the correlation.

Correlations may be determined and quantified as correlation factors through a number of methods. Research and development testing of a memory design may be performed. Analytics may be gathered from devices operating in the field. Large scale experimentation may be implemented. Machine learning may be employed. Correlations determined through these methodologies may then be used to implement the solution disclosed herein.

Figure 8:
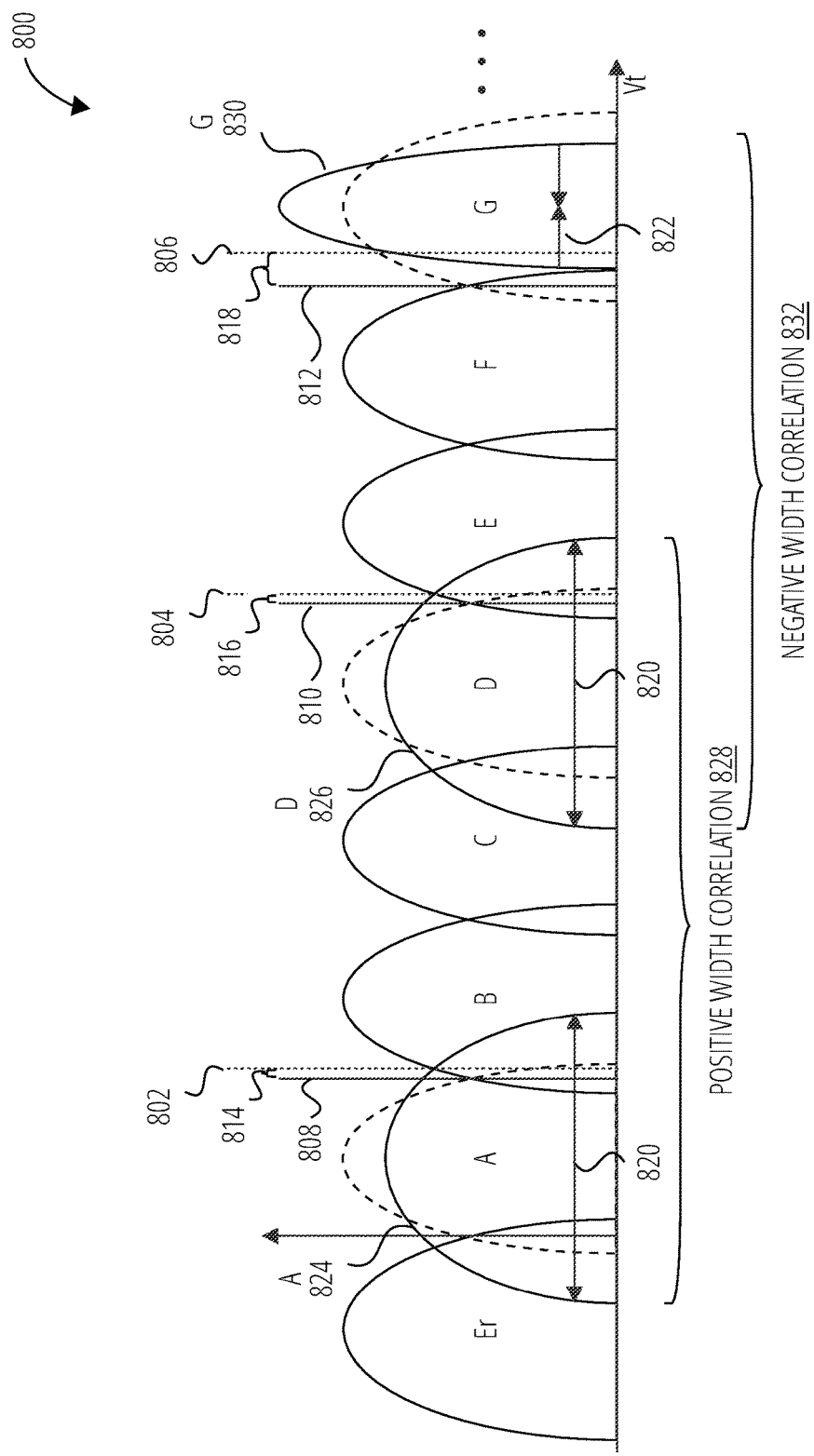
FIG. 8 illustrates correlations between memory states 800 in accordance with one embodiment.

FIG. 8 depicts an example of correlations between memory states 800 and adjustments to read levels for a set of multi-level storage cells of non-volatile memory media. In FIG. 7 a change in threshold voltage for memory cells may result in a shift in the threshold voltages and the corresponding cell threshold voltage distribution(s), e.g., the curves.

FIG. 8 illustrates another change phenomena for memory cells and the corresponding a cell threshold voltage distribution(s), e.g., the curves. FIG. 8 illustrates that certain memory states may have a correlation to another memory state based on a widening or narrowing of the cell threshold voltage distribution(s), referred to herein as width correlations. Those of still in the art may appreciate that certain non-volatile storage media technologies may, or may not, experience one, or the other, or both of the types of width correlations (widening and narrowing). However, the concepts disclosed and claimed herein apply to non-volatile storage media technologies that experience or one, or the other, or both of the width correlations. "Width correlation" refers to a correlation in which memory cells of a cell threshold voltage distribution within a first memory state change threshold voltage in a manner that widens or narrows a curve representing the cell threshold voltage distribution within the first memory state in response to passage of time, or use of a storage device, in a manner that correlates to a change of threshold voltage in a manner that widens or narrows a curve representing the cell threshold voltage distribution within the second memory state.

In the example illustrated, adjustments to create adjusted read level B 802, adjusted read level E 804, and adjusted read level G 806 have been made. The previous read levels are also indicated as previous read level B 808, previous read level E 810, and previous read level G 812. The read scan operation, in one embodiment, determines different adjustments to the previous read levels, resulting in the adjusted read levels. The read scan operation may determine adjustment 814, adjustment 816, and adjustment 818 individually for the different memory states B, E, and G, with different magnitudes, different directions, and the like, customizing the different adjustment levels, adjusted read level B 802, adjusted read level E 804, adjusted read level G 806 individually to media characteristics of the different memory states B, E, and G. Each memory state Er, A, B, C, etc., through O as illustrated in FIG. 4 may receive this treatment. A subset of the memory states, Er through G, are illustrated here for convenience. The adjusted read levels align with the changed cell threshold voltage distributions.

Whereas FIG. 7 illustrated shifting of memory states and shift correlations between memory states, FIG. 8 illustrates an example of correlations between memory states based on a change in width of two cell threshold voltage distributions. Some memory states may exhibit an increasing width 820 while others exhibit a decreasing width (narrowing) 822. In the illustrated example, an increasing width 820 of memory state A 824 may necessitate the adjustment 814 resulting in the adjusted read level B 802. An increasing width 820 in memory state D 826 may similarly result in adjusted read level E 804, whereas a decreasing width (narrowing) 822 of memory state G 830 may yield adjusted read level G 806.

One may observe that the increasing width 820 of memory state A 824 is frequently accompanied by an increasing width 820 of memory state D 826. These width relationships are one example of a correlation. Specifically, because the increasing width 820 of memory state A 824 occurs in the same direction as the increasing width 820 of memory state D 826, the correlation between them is referred to as a positive width correlation 828.

One may observe that an increasing width 820 of memory state D 826 is often accompanied by a decreasing width (narrowing) 822 of memory state G 830. This relationship is another example of a correlation. Because the increasing width 820 of memory state D 826 and the decreasing width (narrowing) 822 in memory state G 830 occur in opposite directions, this correlation is referred to as a negative width correlation 832.

FIG. 9 and FIG. 10 illustrate a shift correlation table 900 and a width correlation table 1000, respectively. One embodiment may use one of or both a shift correlation table 900 and a width correlation table 1000 or a table that combines correlation factors from both. In one embodiment, shift correlation table 900 and width correlation table 1000 store correlation factors which are used to improves read scan operations. Shift correlation table 900 and width correlation table 1000 are but examples of a variety of possible types of correlation data structures that embodiments of the claimed solution may use.

"Correlation data structure" refers to a data structure configured to store one or more correlation factors and an index for identifying the correlation factor for a particular correlation between two items or things. In one embodiment, a correlation data structure may be a table, an array, a list, a linked list, portion of a memory, a database, or the like. An index for the correlation data structure for correlation factors between memory states may comprise a row identifier for a memory state of correlation data structure table and a correlated memory state may comprise a column of the correlation data structure table.

In each table, the rows represent a starting memory state and the columns represent an ending memory state for which a correlation exists, that is captured by the correlation factor stored in the cell where the row and column intersect. In one example embodiment, a zero correlation factor may indicate that no correlation, a magnitude of the correlation factor may indicate the strength of the correlation or how much to adjust an attribute (e.g., shift, width, etc.) to account for the correlation, and a positive correlation factor value may represent a positive correlation and a negative correlation factor value may represent a negative correlation.

Generally, the starting memory state, the row memory state, is a memory state for which an optimal read level has been determined through one or more or parts of a variety of methods. Once that optimal read level is determined for the starting memory state, the shift correlation table 900 and/or width correlation table 1000 may be used to account for the correlation between the starting memory state and the ending memory state and leverage the correlation to determine an optimal read level for the ending memory state.

By way of example, suppose a starting memory state 902, memory state D, has been determined and a read scan operation is configured to leverage correlations between memory states in determining a read level for an ending memory state 904, memory state G. The read scan operation may consult shift correlation table 900 and locate the row for memory state D and read the value that intersects with the column corresponding to memory state G. The entry is a shift correlation factor 906 and indicates that when starting memory state 902 shifts then, based on a correlation, the ending memory state 904 shifts in an opposite direction, a negative correlation. The negative correlation is indicated by the negative value 150. In this example, the shift correlation factor 906 (e.g., −150 mV as illustrated) may indicate that memory state G experiences a negative shift of 150 mV (shifts down on average voltage by about −150 mV) with respect to memory state D. The read scan operation may leverage this correlation factor to optimize a scanning operation to determine an optimal read level for memory state G.

FIG. 10 illustrates a width correlation table 1000 having correlation factor that account for width correlations between memory states. As an example, suppose an optimal read level for starting memory state 1002, memory state D, has been determined and a read scan operation is configured to leverage correlations between memory states in determining a read level for an ending memory state 1004, memory state J.

The read scan operation may consult width correlation table 1000 and locate the row for memory state D and read the value that intersects with the column corresponding to memory state J. The entry is a width correlation factor 1006 and indicates that when starting memory state 1002 widens then, based on a correlation, the ending memory state 1004 also widens by a correlation factor of 1.1016, a positive correlation. The positive correlation is indicated by the positive value greater than 1. In this example, the width correlation factor 1006 (e.g., 1.1016 as illustrated) may indicate that memory state J experiences a widening of 1.1016 times a widening experienced by memory state D. The read scan operation may leverage this correlation factor to optimize a scanning operation to determine an optimal read level for memory state J.

If a read scan operation determines how a starting memory state (e.g., state D) has shifted or how much the known state widened/narrowed, estimates may be made for other correlated unknown memory states. These estimates may facilitate further read scan operations, or even in certain embodiments, obviate a need for further read scan operations for the ending memory state.

In this manner, a read scan operation may leverage a correlation between two memory states as a starting point for analysis. This may allow the best location for these read levels to be determined using fewer iterations, or more narrowly spaced read level windows for a valley search operation, in one embodiment. In another embodiment, the location given through use of these tables (shift correlation table 900, width correlation table 1000) may enable optimization of a BES read scan operation.

Figure 11:
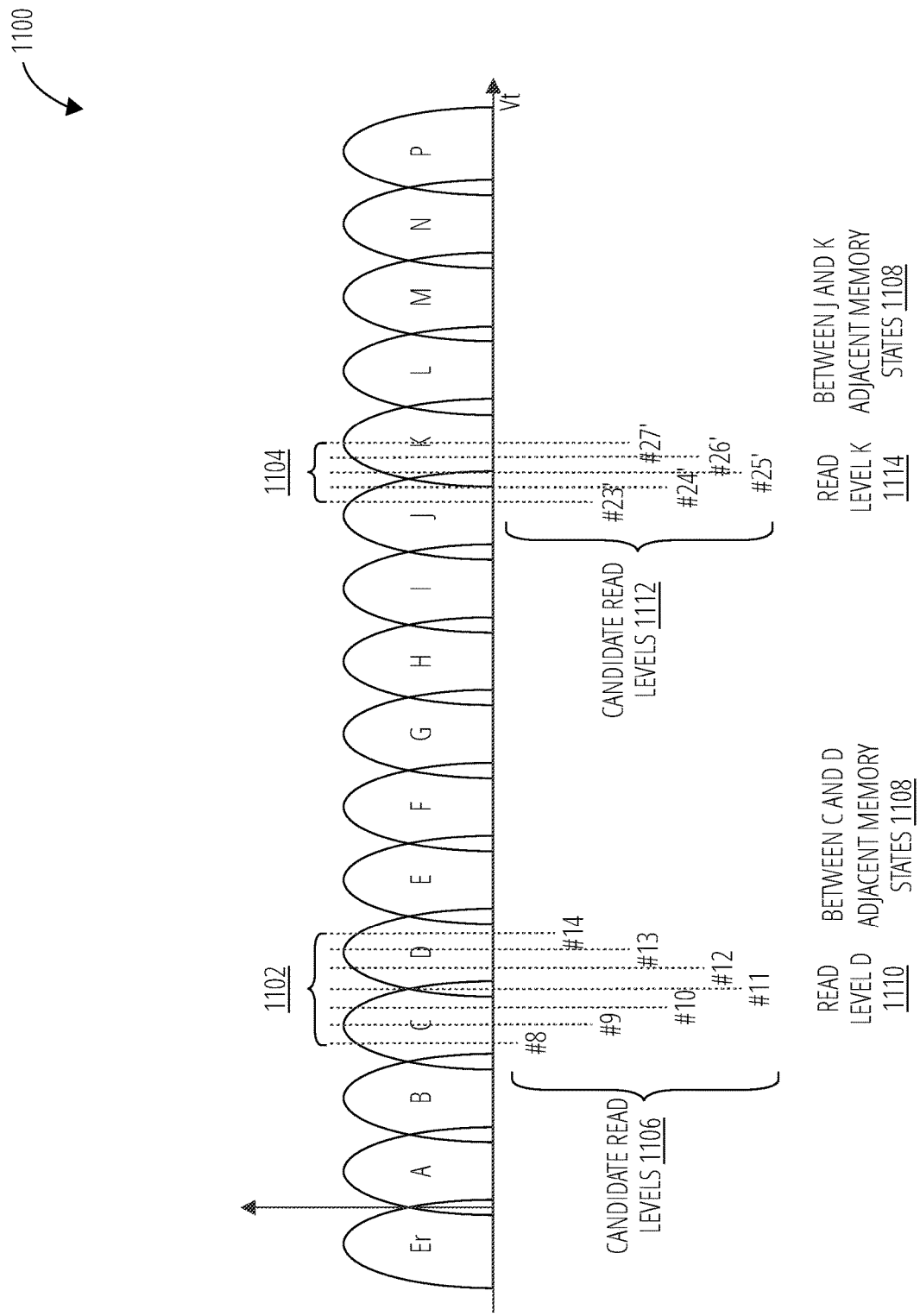
FIG. 11 illustrates a read scan operation 1100 in accordance with one embodiment.

FIG. 11 illustrates a read scan operation 1100 in accordance with one embodiment. The read scan operation 1100 illustrated may comprise using an optimal read level determined within first read level window 1102 to more efficiently scan another read level window, such as second read level window 1104.

A read scan operation may scan read levels within first read level window 1102 checking for a first candidate read level, among candidate read levels 1106, that activates the fewest number of memory cells in relation to other candidate read levels 1106 within the first read level window 1102. This first read level window 1102 may be configured to test candidate read levels 1106 between adjacent memory states 1108, memory state C and memory state D to locate an optimal read level D 1110.

Once a read scan operation determines read level D 1110, the read scan operation may configure a second read level window 1104 based on a correlation between at least one of the two adjacent memory states 1108 (e.g., C or D) and one or more other adjacent memory states 1108 associated with the second read level window 1104 (e.g., J and K). Advantageously, in one embodiment, the correlation enables the second read level window 1104 to be smaller, e.g., include fewer candidate read levels 1112 than had a correlation not been used to configure the second read level window 1104.

Next, the read scan operation scans a second read level window 1104. Scanning the configured second read level window 1104 for a second candidate read level may include determining a second candidate read level that activates the fewest number of memory cells in relation to the other candidate read levels 1112 within the second read level window 1104. Once the read scan operation determines an optimal read level D 1110 and optimal read level K 1114, the read scan operation configures a read operation to use optimal read level D 1110 and optimal read level K 1114.

In one embodiment, configuring the second read level window 1104 may involve determining a correlation factor based on an identifier for one of the two adjacent memory states 1108 associated with the first read level window 1102 (memory state C and memory state D). This identifier may be related a label given the memory state, such as "C" or "D" in the illustrated example, or some other unique identifier for the memory state. Correlation factors, in one embodiment, may be determined using a correlation data structure, such as a shift correlation table 900 and/or width correlation table 1000.

The read scan operation may apply a determined correlation factor to the second read level window 1104 such that the correlation affects the candidate read levels 1112 of the second read level window 1104. For second read level window 1104, for example, the candidate read levels 1112 #23', #24', #25', #26', and #27', may be centered around a projected threshold voltage, e.g., #25' determined by using the a correlation factor between memory state C and memory state J or memory state C and memory state K, or memory state D and memory state J and memory state D and memory state K.

In one embodiment, the correlation factor is used to narrow the spacing between candidate read levels 1112, (e.g., #23' through #27') and/or may be used to scan fewer candidate read levels (e.g., 4 versus 7, 4 because #25' is a starting read level). Consequently, second read level window 1104 is smaller, has fewer candidate read levels 1112, than a read level window without using a correlation and/or correlation factor and results in a faster scanning time.

In one embodiment, applying the correlation factor may comprise multiplying a candidate read level of the second read level window 1104 by the correlation factor. In another embodiment, applying the correlation factor may comprise changing a predefined order for testing/checking the candidate read levels 1112 of the second read level window 1104 such that candidate read levels that incorporate the correlation are used in the scanning.

In one embodiment, a read scan operation may scan candidate read levels 1112 in a predefined order. For example, the predefined order may alternate between a high threshold voltage candidate read level and low threshold voltage candidate read level (e.g., #24', #26', #23', #27'). In one embodiment, applying a correlation factor to configure second read level window 1104 may include changing the predefined order to a new order based on the correlation factor. For example, suppose a correlation is a negative shift correlation (e.g., negative shift correlation 726). In one embodiment, the read scan operation may be configured to change the predefined order to leverage the negative shift correlation and so the changed order of candidate read levels may be #24', #23', #26', #27", such that the lower threshold voltage candidates are examined before the higher threshold voltage candidates. In another example, if a correlation indicates a strong likelihood that a memory state may experience widening, the outermost candidates may be used first, and the scan may work its way inward.

In one embodiment, suppose a correlation indicates a likelihood that a second candidate read level may be more optimal than a first candidate read level. In such an embodiment, a read scan operation may change a predefined order by skipping iteratively testing a first candidate read level in response to the second candidate read level activating the fewest number of memory cells in relation to other candidate read levels within the second read level window 1104.

In the example of FIG. 11, correlations between one or the other of memory state C and memory state D and one or the other of memory state J and memory state K. In one embodiment, selection of a correlation to use between two states may be based on attributes of the correlations. If the correlations between two states are symmetrical, meaning a correlation from memory state A to memory state J is an inverse of a correlation from memory state J to memory state A, then there are four possible correlations between one or the other of memory state C and memory state D and one or the other of memory state J and memory state K. If the correlations are not symmetrical then there are eight possible correlations.

In such a situation, the read scan operation may use a correlation that is a most stable correlation between two memory states being considered. "Stable correlation" refers to a correlation that comprises an accuracy rate and/or a set of historical testing or supporting data such that the correlation is true for a majority of instances in the future.

Based on a stability measure for the possible correlations, a read scan operation may select a first memory state from the two adjacent memory states and a second memory state from the other adjacent memory states associated with the second read level window in response to the first memory state and the second memory state having a stable correlation. In the example illustrated in FIG. 11, between memory states C and D (adjacent memory states) and memory states J and K (other adjacent memory states), there may be between one and eight correlations. If a correlation between memory state C and memory state K is a stable correlation and/or a more stable correlation than other correlations that may be used, the read scan operation may use the correlation between memory state C and memory state K to configure the second read level window 1104.

Figure 12:
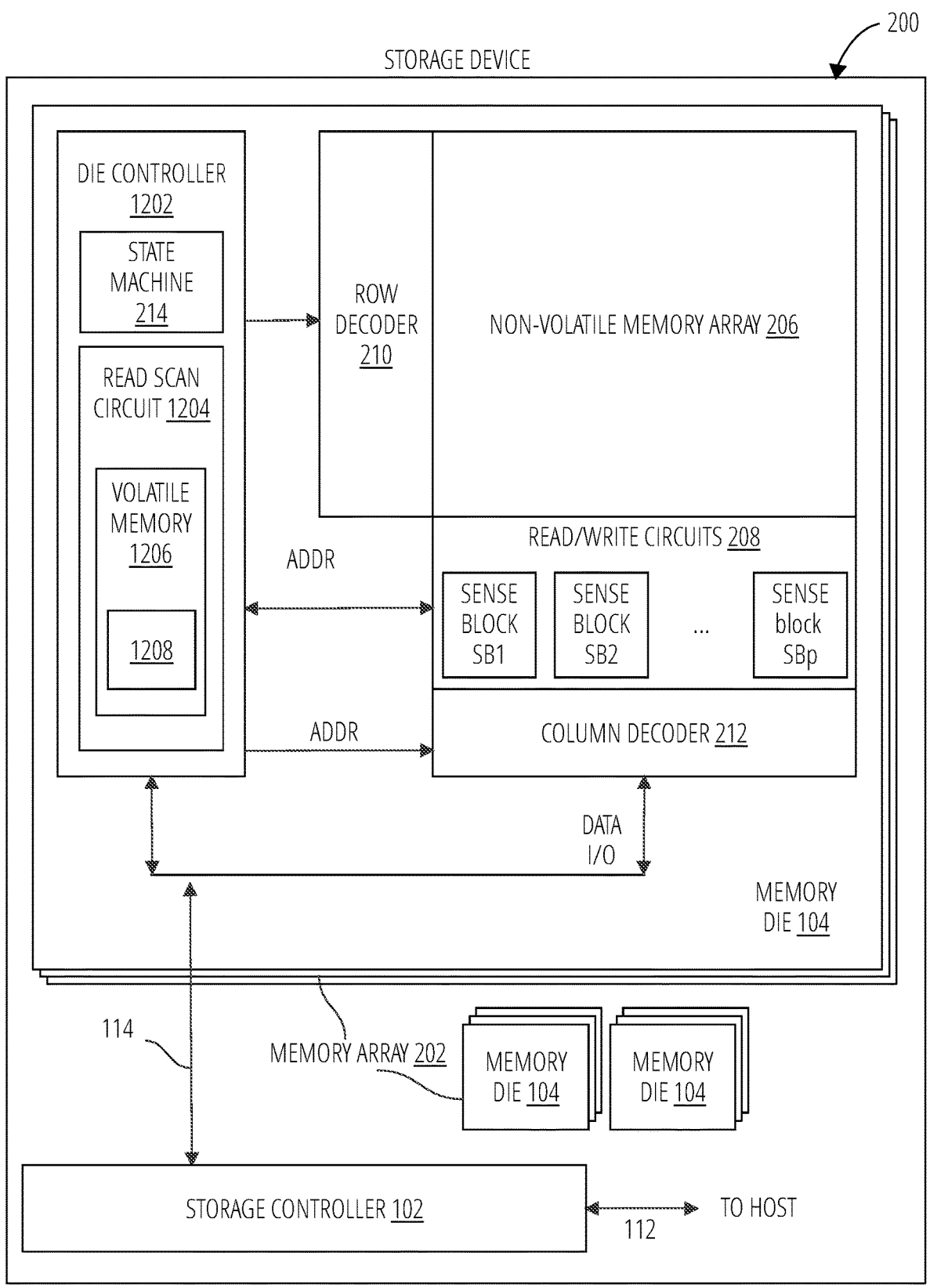
FIG. 12 illustrates a storage device 200 in accordance with one embodiment.

FIG. 12 is a block diagram of an exemplary storage device 200. Many of the components comprising the storage device 200 may operate effectively as described with regard to FIG. 1 and FIG. 2. However, the storage device 200 may incorporate a die controller 1202 configured according to one embodiment of the claimed solution. The die controller 1202 may include a state machine 214, a read scan circuit 1204, and a volatile memory 1206. The volatile memory 1206 may be used to access a correlation data structure 1208.

The non-volatile memory array 206 may be a three-dimensional memory array comprising a number of memory cells. These memory cells may be quad-level cells, such that each memory cell may store four bits of data, as described with regard to FIG. 4 and FIG. 5. The die controller 1202 may be configured to execute storage operations on the memory cells of the non-volatile memory array 206 (three-dimensional memory array).

The die controller 1202 may cooperate with the read/write circuits 208 to perform memory operations on these memory cells and may include a state machine 214 that provides chip-level control of memory operations. In one embodiment, the read scan circuit 1204 is configured to adjust one or more read levels between memory states. In one embodiment, the read scan circuit 1204 implements a valley search operation to determine whether or not to adjust read levels.

The read scan circuit 1204 of the die controller 1202 may be configured to iteratively sense a set of memory cells using a first set of candidate read levels until a candidate read level activates a fewest number of memory cells in relation to other candidate read levels within the first set. The read scan circuit 1204 may then determine a first read level for a first memory state based on the candidate read level that activates the fewest number of memory cells.

A volatile memory 1206 coupled to the read scan circuit 1204 may comprise a correlation data structure 1208 configured to store correlation factors for one or more and potentially each memory state for the set of memory cells. The correlation factors stored in the correlation data structure 1208 may represent correlations between memory states, and multiplying a candidate read level by the correlation factor may modify the candidate read level to account for the correlation.

The read scan circuit 1204 may in one embodiment be configured to retrieve a correlation between the first memory state and a second memory state. The read scan circuit 1204 may retrieve the correlation from the correlation data structure 1208. Shift correlation table 900 and width correlation table 1000 are two examples of correlation data structure 1208.

Next, the read scan circuit 1204 may determine a second read level for the second memory state using the correlation. This correlation may be stored in the correlation data structure 1208 (e.g., shift correlation table 900 and/or width correlation table 1000) available in volatile memory 1206. Determining a correlation factor may involve the read scan circuit 1204 searching the correlation data structure 1208 based on an identifier (e.g., 'Er', 'A', 'B', 'C', etc.) for one of two adjacent memory states associated with the read level being scanned/checked. The read scan circuit 1204 may then apply the determined correlation factor to the second read level.

In certain embodiments, a read scan circuit 1204 may apply a correlation factor directly to a current read level for a second memory state and thereby determine the second read level without testing or checking candidate read levels for a second read level window. For example, the read scan circuit 1204 may multiple the current read level by the correlation factor that represents a correlation between the first memory state and the second memory state. In such an embodiment, determining the second read level may be more efficient and may be made possible where the correlation between two memory states is strong enough to skip testing candidate read levels for a second read level window 1104.

in certain embodiments, read scan operations may be more efficient if a first read level for a first memory state may be determined through thorough scanning, checking, or testing. Next, a correlation, that is as accurate as possible, between the first memory state and second memory state may be used to determine read levels, or adjustments to read levels for the second memory state. Read levels for the second memory state may, in some embodiments, be adjusted based on the correlation, obviating the need for equally thorough (and time consuming) testing for adjustments to read levels associated with the second memory state.

In one embodiment, the read scan circuit 1204 may determine the second read level by multiplying a current read level for the second memory state by a correlation factor representative of the correlation. In other embodiments, the read scan circuit 1204 may determine the second read level by choosing a second set of candidate read levels based on the correlation. This second set of candidate read levels may be smaller than the first set of candidate read levels (e.g., second read level window 1104 as illustrated in FIG. 11 may be smaller than read level window 608 shown in FIG. 6). The read scan circuit 1204 iteratively tests the second set of candidate read levels until the candidate read level activates a fewest number of memory cells in relation to other candidate read levels within the second set of candidate read levels to determine the second read level for the second memory state.

The read scan circuit 1204 may thus be used by the die controller 1202 to determine the most suitable read levels for memory states as described above for the first read level and the second read level. The die controller 1202 may then interact with the state machine 214 and read/write circuits 208 to set the first read level and the second read level, as well as other determined read levels for the memory states expressed by the memory cells of the non-volatile memory array 206. These set read levels may be used for subsequent read operations.

Figure 13:
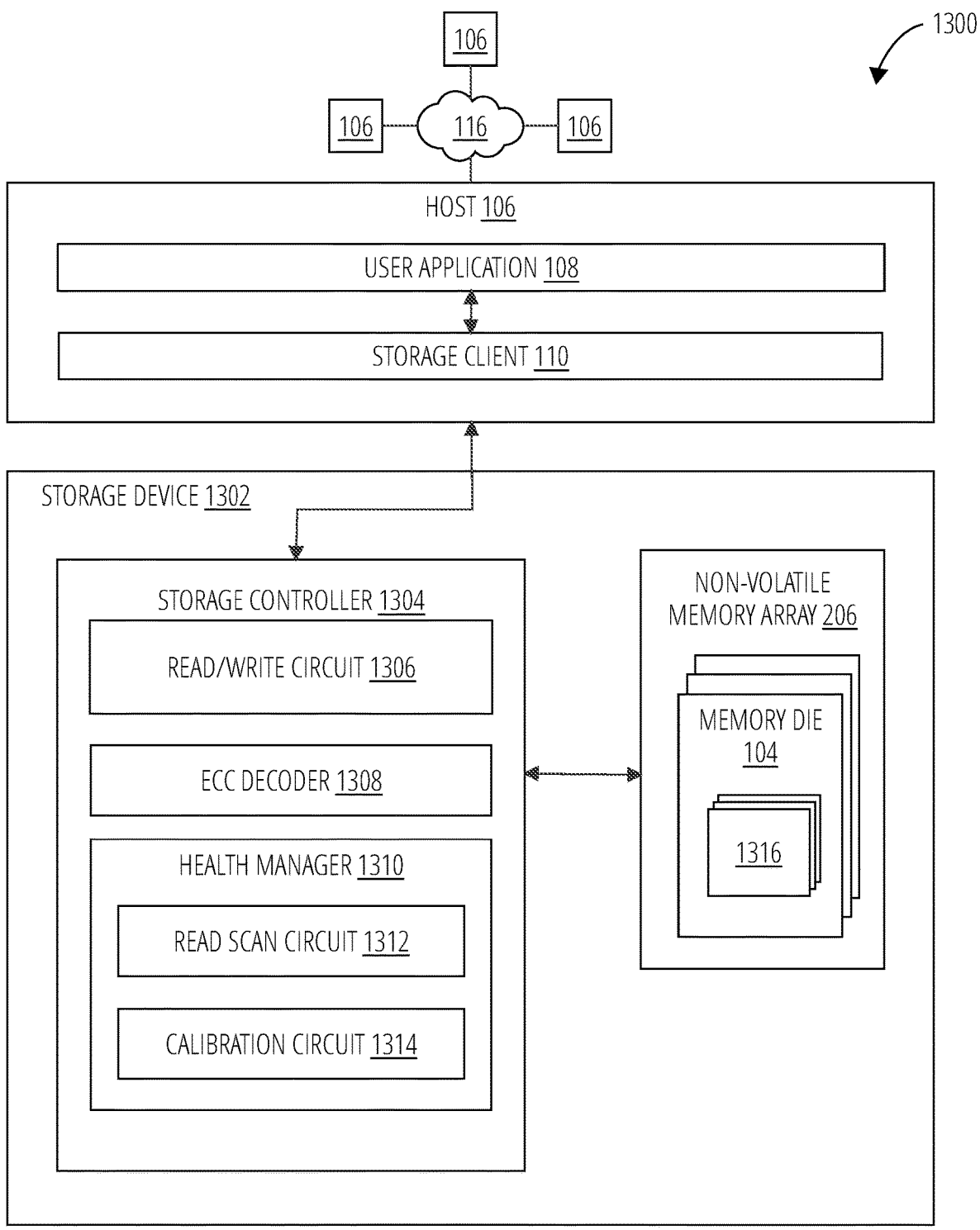
FIG. 13 is a block diagram of an example storage system 1300 in accordance with one embodiment.

FIG. 13 is a schematic block diagram of a storage system 1300 in accordance with one embodiment. The storage system 1300 may include a storage device 1302 that comprises a storage controller 1304 and non-volatile memory array 206. The storage controller 1304 may further comprise a read/write circuit 1306, an error correction code decoder 1308, and a health manager 1310 including a read scan circuit 1312. Those of skill in the art will appreciate that these components may be incorporated within other parts of the storage device 1302 or may be carried out by the host 106 in certain embodiments.

"Health manager" refers to any hardware, software, firmware, circuit, component, module, logic, device, or apparatus configured, programmed, designed, arranged, or engineered to review, test, check, configure, adjust, and/or adapt configuration parameters for memory cells, a memory die, and/or a storage controller so as to prolong the usefulness, effectiveness, and/or efficiency of a storage device.

The read/write circuit 1306 is configured to service storage operations to provide storage services to one or more storage clients 110. The read/write circuit 1306 may be configured to write data to memory cells of the plurality of memory dies 104. The read/write circuit 1306 coordinates with the error correction code decoder 1308 to service write commands and read commands.

The health manager 1310, in one embodiment, may manage and monitor the health of the non-volatile storage media of the non-volatile memory array 206. In one embodiment, the health manager 1310 executes a read scan operation on one or more, or each of the storage blocks of the non-volatile memory array 206. As the health manager 1310 detects storage blocks having a health condition that is causing more bit errors (a higher bit error rate), the health manager 1310 may adjust read levels for memory states to reduce a bit error rate, recover data, and/or extend the life of non-volatile storage media.

The health manager 1310 may include a read scan circuit 1312 and a calibration circuit 1314. "Read scan circuit" refers to any circuit, sub-circuit, electronic component, hardware, software, firmware, module, logic, device, or apparatus configured, programmed, designed, arranged, or engineered to execute a read scan operation. "Calibration circuit" refers to any circuit, sub-circuit, electronic component, hardware, software, firmware, module, logic, device, or apparatus configured, programmed, designed, arranged, or engineered to change, alter, modify, update, configure, or calibrate a configuration parameter, including but not limited to a read level.

The read scan circuit 1312 reads data from storage blocks of the non-volatile memory array 206 and coordinates with the health manager 1310 to determine a health for the storage cells of the storage block. The read scan circuit 1312 may implement a read scan operation and may check memory state read levels of each storage block.

The read scan circuit 1312 may read data from a storage block to determine appropriate read levels. For example, in one embodiment, the health manager 1310 may implement a BES read scan operation using the read scan circuit 1312, calibration circuit 1314, and error correction code decoder 1308. The read scan circuit 1312 may coordinate with the error correction code decoder 1308 to determine a bit error rate, or an estimated or proxy bit error rate, for each read of a storage block, this bit error rate may be called a read bit error rate. In one embodiment, the error correction code decoder 1308 determines the bit error rate without doing any error correction or detection. In another embodiment, the error correction code decoder 1308 determines the bit error rate after attempting or completing error correction or detection.

"Error correction code decoder" refers to any hardware, software, firmware, circuit, component, module, logic, device, or apparatus configured, programmed, designed, arranged, or engineered to detect and/or correct errors in a data set using redundancy information defined for the data set (e.g., a code word). The error correction code decoder, in one embodiment, may comprise one or more types of decoder, including, but not limited to, a low density parity check (LDPC) decoder, a Reed-Solomon code decoder, a Golay code decoder, a Bose Chaudhuri Hocquenghem (BCH) code decoder, a turbo code decoder, a multidimensional parity code decoder, a Hamming code decoder, a Hadamard code decoder, an expander code decoder, a Reed-Muller code decoder, a Viterbi decoder, a Fano decoder, or the like.

In one embodiment, the read scan circuit 1312 manages the non-volatile memory array 206 by proactively setting and adjusting configuration parameters for storage cells of the non-volatile memory array 206. By determining configuration parameters proactively before an error occurs, the read scan circuit 1312 may prevent certain errors from occurring, without the performance penalty of retrying reads or performing other remedial measures for the prevented errors. The read scan circuit 1312, in certain embodiments, adapts configuration parameters for a use case of the storage device 1302 to configure storage cells for the use case instead of using default configuration parameters.

The read scan circuit 1312 references one or more media characteristics for a set of storage cells to determine a configuration parameter for the set of storage cells. The read scan circuit 1312, in response to determining a configuration parameter for a set of storage cells, may configure the set of storage cells to use the determined configuration parameter. The read scan circuit 1312 may periodically update media characteristics for a set of storage cells, update a configuration parameter for the set of storage cells, and reconfigure the set of storage cells to use the updated configuration parameter. The read scan circuit 1312 may configure storage cells with configuration parameters during execution of input/output operations, during a startup operation, in response to a background scan of a set of storage cells indicating a changed media characteristic, or the like.

In one embodiment, the health manager 1310 may implement a BES read scan operation that uses the read scan circuit 1312. The read scan circuit 1312 may iteratively read data of a storage block using a predetermined number of candidate read levels. The read scan circuit 1312 may test candidate read levels of a set of candidate read levels based on a correlation between two memory states for memory cells of the storage block. The error correction code decoder 1308 may determine an estimated bit error rate for the data read during the read scan operation (e.g., as part of a BES read scan operation), and the calibration circuit 1314 may calibrate memory cells based on the read levels determined by the read scan circuit 1312.

In one embodiment, the read scan circuit 1312 may determine a first read level for reading data programmed to a first set of memory cells of the storage block 1316. The first set of memory cells may be associated with a first memory state.

The read scan circuit 1312 may determine a correlation between a memory state for the first set of memory cells and a memory state for a second set of memory cells. Next, the read scan circuit 1312 may determine a second read level for reading data programmed to the second set of memory cells. The second read level may be determined based on the correlation between the memory state for the first set of memory cells and the memory state for the second set of memory cells.

The read scan circuit 1312 may then set the first read level as a current read level for reading data from the first set of memory cells and may set the second read level as a current read level for reading data from the second set of memory cells. One skilled in the art will recognize that the read scan circuit 1312 and calibration circuit 1314 may reside in logic modules other than a health manager 1310. This illustration is not intended to limit this aspect of the disclosed system.

Figure 14:
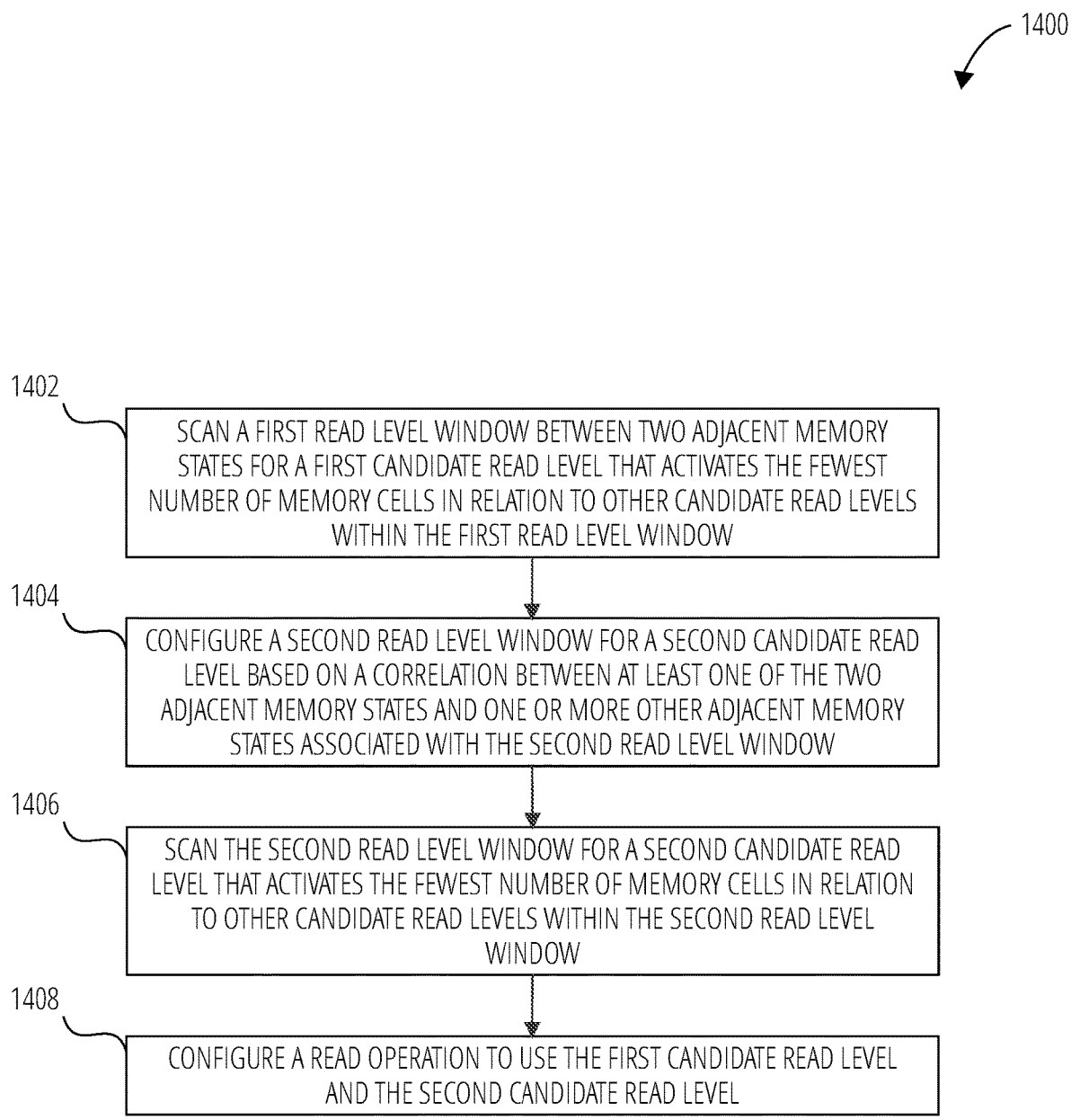
FIG. 14 illustrates a method for conducting a read scan operation 1400 in accordance with one embodiment.

FIG. 14 illustrates a method for conducting a read scan operation 1400 in accordance with one embodiment. At block 1402, a read scan circuit may scan a first read level window for a first candidate read level that activates the fewest number of memory cells in relation to other candidate read levels within the first read level window. The first read level window may test read levels between two adjacent memory states.

In block 1404, the read scan circuit may configure a second read level window for a second candidate read level based on a correlation. The correlation is between at least one of the two adjacent memory states and one or more other adjacent memory states associated with the second read level window.

In block 1406, the read scan circuit may scan the second read level window for a second candidate read level that activates the fewest number of memory cells in relation to other candidate read levels within the second read level window. Once the first candidate read level and second candidate read level are determined by the read scan circuit, in block 1408, the read scan circuit may configure a read operation to use the first candidate read level and the second candidate read level.

Figure 15:
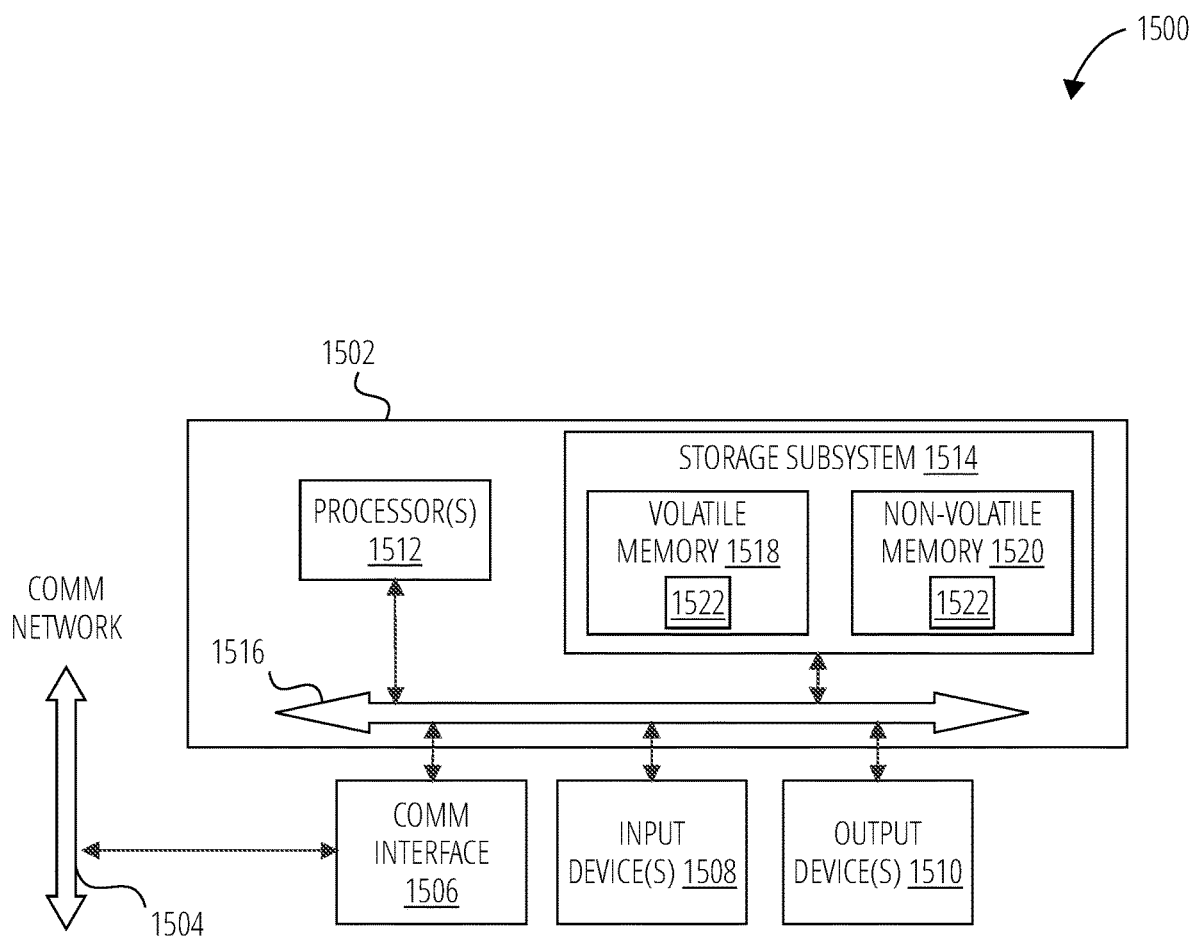
FIG. 15 is an example block diagram of a computing device 1500 that may incorporate certain embodiments.

FIG. 15 is an example block diagram of a computing device 1500 that may incorporate embodiments of the solution. FIG. 15 is merely illustrative of a machine system to carry out aspects of the technical processes described herein and does not limit the scope of the claims. One of ordinary skill in the art would recognize other variations, modifications, and alternatives. In certain embodiments, the computing device 1500 includes a data processing system 1502, a communication network 1504, communication network interface 1506, input device(s) 1508, output device(s) 1510, and the like.

As depicted in FIG. 15, the data processing system 1502 may include one or more processor(s) 1512 and a storage subsystem 1514. "Processor" refers to any circuitry, component, chip, die, package, or module configured to receive, interpret, decode, and execute machine instructions. "Instructions" refers to symbols representing commands for execution by a device using a processor, microprocessor, controller, interpreter, or other programmable logic. Broadly, 'instructions' can mean source code, object code, and executable code. "Instructions" herein is also meant to include commands embodied in programmable read-only memories (EPROM) or hard coded into hardware (e.g., "micro-code") and like implementations wherein the instructions are configured into a machine read-only memory or other hardware component at manufacturing time of a device. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

The processor(s) 1512 communicate with a number of peripheral devices via a bus subsystem 1516. These peripheral devices may include input device(s) 1508, output device(s) 1510, communication network interface 1506, and the storage subsystem 1514. The storage subsystem 1514, in one embodiment, comprises one or more storage devices and/or one or more memory devices.

"Storage device" or "memory device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may comprise one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND FLASH memory (e.g., 2D NAND FLASH memory, 3D NAND FLASH memory), NOR FLASH memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, storage media, storage, non-volatile memory, volatile memory medium, non-volatile storage medium, non-volatile storage, or the like.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

In one embodiment, the storage subsystem 1514 includes a volatile memory 1518 and a non-volatile memory 1520. The volatile memory 1518 and/or the non-volatile memory 1520 may store computer-executable instructions that alone or together form logic 1522 that when applied to, and executed by, the processor(s) 1512 implement embodiments of the processes disclosed herein.

"Volatile memory" refers to a shorthand name for volatile memory media. In certain embodiments, volatile memory refers to the volatile memory media and the logic, controllers, processor(s), state machine(s), and or other periphery circuits that manage the volatile memory media and provide access to the volatile memory media.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory.

While the volatile memory media is referred to herein as "memory media," in various embodiments, the volatile memory media may more generally be referred to as volatile memory.

"Non-volatile memory" refers to shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The input device(s) 1508 include devices and mechanisms for inputting information to the data processing system 1502. These may include a keyboard, a keypad, a touch screen incorporated into a graphical user interface, audio input devices such as voice recognition systems, microphones, and other types of input devices. In various embodiments, the input device(s) 1508 may be embodied as a computer mouse, a trackball, a track pad, a joystick, wireless remote, drawing tablet, voice command system, eye tracking system, and the like. The input device(s) 1508 typically allow a user to select objects, icons, control areas, text and the like that appear on a graphical user interface via a command such as a click of a button or the like.

The output device(s) 1510 include devices and mechanisms for outputting information from the data processing system 1502. These may include a graphical user interface, speakers, printers, infrared LEDs, and so on, as well understood in the art. In certain embodiments, a graphical user interface is coupled to the bus subsystem 1516 directly by way of a wired connection. In other embodiments, the graphical user interface couples to the data processing system 1502 by way of the communication network interface 1506. For example, the graphical user interface may comprise a command line interface on a separate computing device 1500 such as desktop, server, or mobile device.

The communication network interface 1506 provides an interface to communication networks (e.g., communication network 1504) and devices external to the data processing system 1502. The communication network interface 1506 may serve as an interface for receiving data from and transmitting data to other systems. Embodiments of the communication network interface 1506 may include an Ethernet interface, a modem (telephone, satellite, cable, ISDN), (asynchronous) digital subscriber line (DSL), FireWire, USB, a wireless communication interface such as Bluetooth or WiFi, a near field communication wireless interface, a cellular interface, and the like.

The communication network interface 1506 may be coupled to the communication network 1504 via an antenna, a cable, or the like. In some embodiments, the communication network interface 1506 may be physically integrated on a circuit board of the data processing system 1502, or in some cases may be implemented in software or firmware, such as "soft modems", or the like.

The computing device 1500 may include logic that enables communications over a network using protocols such as HTTP, TCP/IP, RTP/RTSP, IPX, UDP and the like.

The volatile memory 1518 and the non-volatile memory 1520 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 1518 and the non-volatile memory 1520 may be configured to store the basic programming and data constructs that provide the functionality of the disclosed processes and other embodiments thereof that fall within the scope of the present disclosure.

Logic 1522 that implements one or more parts of embodiments of the solution may be stored in the volatile memory 1518 and/or the non-volatile memory 1520. Logic 1522 may be read from the volatile memory 1518 and/or non-volatile memory 1520 and executed by the processor(s) 1512. The volatile memory 1518 and the non-volatile memory 1520 may also provide a repository for storing data used by the logic 1522. "Repository" refers to any data source or dataset that includes data, or content. In one embodiment, a repository resides on a computing device. In another embodiment, a repository resides on a remote computing or remote storage device. A repository may comprise a file, a folder, a directory, a set of files, a set of folders, a set of directories, a database, an application, a software application, content of a text, content of an email, content of a calendar entry, and the like. A repository, in one embodiment, comprises unstructured data. A repository, in one embodiment, comprises structured data such as a table, an array, a queue, a look up table, a hash table, a heap, a stack, or the like. A repository may store data in any format including binary, text, encrypted, unencrypted, a proprietary format, or the like.

The volatile memory 1518 and the non-volatile memory 1520 may include a number of memories including a main random access memory (RAM) for storage of instructions and data during program execution and a read only memory (ROM) in which read-only non-transitory instructions are stored. The volatile memory 1518 and the non-volatile memory 1520 may include a file storage subsystem providing persistent (non-volatile) storage for program and data files. The volatile memory 1518 and the non-volatile memory 1520 may include removable storage systems, such as removable FLASH memory.

The bus subsystem 1516 provides a mechanism for enabling the various components and subsystems of data processing system 1502 communicate with each other as intended. Although the communication network interface

1506 is depicted schematically as a single bus, some embodiments of the bus subsystem 1516 may utilize multiple distinct busses.

It will be readily apparent to one of ordinary skill in the art that the computing device 1500 may be a device such as a smartphone, a desktop computer, a laptop computer, a rack-mounted computer system, a computer server, or a tablet computer device. As commonly known in the art, the computing device 1500 may be implemented as a collection of multiple networked computing devices. Further, the computing device 1500 will typically include operating system logic (not illustrated) the types and nature of which are well known in the art.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method of performing a read scan operation on a memory having a plurality of memory cells, the method comprising:
    scanning a first read level window for a first candidate read level that activates a fewest number of memory cells in relation to other candidate read levels within the first read level window, the first read level window configured to test read levels between two adjacent memory states;
    configuring a second read level window for a second candidate read level based on a correlation between at least one of the two adjacent memory states and one or more other adjacent memory states associated with the second read level window;
    scanning the second read level window for a second candidate read level that activates the fewest number of memory cells in relation to other candidate read levels within the second read level window; and
    configuring a read operation to use the first candidate read level and the second candidate read level.

2. The method of claim 1, wherein configuring the second read level window comprises:
    determining a correlation factor by searching a correlation data structure based on an identifier for one of the two adjacent memory states;
    applying the correlation factor to the second read level window such that the correlation affects candidate read levels of the second read level window.

3. The method of claim 2, wherein applying the correlation factor comprises multiplying a candidate read level of the second read level window by the correlation factor such that the candidate read level accounts for the correlation factor.

4. The method of claim 2, wherein applying the correlation factor comprises changing a predefined order for the candidate read levels of the second read level window such that candidate read levels that account for the correlation are used in the scanning before other candidate read levels.

5. The method of claim 1, wherein the configured second read level window comprises fewer candidate read levels than the first read level window.

6. The method of claim 1, wherein the correlation comprises a positive correlation between a first memory state and a second memory state.

7. The method of claim 1, wherein the correlation comprises a negative correlation between a first memory state and a second memory state.

8. The method of claim 1, wherein scanning the first read level window comprises:
  testing the first candidate read level and the second candidate read level in a predefined order; and
  designating the first candidate read level as the first read level in response to the second candidate read level activating more memory cells than the first candidate read level.

9. The method of claim 1, wherein scanning the second read level window further comprises iteratively testing candidate read levels in a predefined order and wherein configuring the second read level window comprises changing the predefined order based on the correlation.

10. The method of claim 9, wherein changing the predefined order comprises skipping iteratively testing a first candidate read level in response to the second candidate read level activating the fewest number of memory cells in relation to other candidate read levels within the second read level window, the second candidate read level determined based on the correlation.

11. The method of claim 1, further comprising determine the correlation based on a first memory state from the two adjacent memory states and a second memory state from the other adjacent memory states associated with the second read level window in response to the first memory state and the second memory state having a stable correlation.

12. An apparatus, comprising:
  a three-dimensional memory array of memory cells; and
  a read scan circuit configured to:
    iteratively sense a set of memory cells using a first set of candidate read levels until a candidate read level activates a fewest number of memory cells in relation to other candidate read levels within the first set of candidate read levels;
    determine a first read level for a first memory state based on the candidate read level that activates the fewest number of memory cells;
    retrieve a correlation between the first memory state and a second memory state;
    determine a second read level for the second memory state using the correlation; and
    set the first read level and the second read level for subsequent read operations.

13. The apparatus of claim 12, wherein the read scan circuit determines the second read level by multiplying a current read level for the second memory state by a correlation factor representative of the correlation.

14. The apparatus of claim 12, wherein the read scan circuit determines the second read level by:
  choosing a second set of candidate read levels based on the correlation, wherein the second set of candidate read levels is smaller than the first set of candidate read levels; and
  determining the second read level for the second memory state by iteratively testing the second set of candidate read levels until the candidate read level activates a fewest number of memory cells in relation to the other candidate read levels within the second set of candidate read levels.

15. The apparatus of claim 12, further comprising:
  a volatile memory coupled to the read scan circuit, the volatile memory comprising a correlation data structure configured to store correlation factors for each memory state of the set of memory cells;
  wherein the correlation factor represents the correlation and multiplying the candidate read level by the correlation factor modifies the candidate read level to account for the correlation.

16. The apparatus of claim 12, wherein the correlation between the first memory state and the second memory state comprises a width correlation configured to represent a relationship between a widening of cell threshold voltage distribution in the first memory state in relation to the widening of cell threshold voltage distribution in the second memory state.

17. The apparatus of claim 12, wherein the correlation between the first memory state and the second memory state comprises a shift correlation configured to represent a relationship between a shifting of cell threshold voltage distribution in the first memory state in relation to the shifting of cell threshold voltage distribution in the second memory state.

18. A system, comprising:
  a non-volatile memory array comprising a plurality of memory dies; and
  a storage controller comprising:
    a read/write circuit configured to write data to memory cells of the plurality of memory dies;
    a read scan circuit configured to implement a read scan operation for a storage block of a plurality of storage blocks of the non-volatile memory array, the read scan operation configured to test candidate read levels of a set of candidate read levels based on a correlation between two memory states for memory cells of the storage block;
    an error correction code decoder configured to determine an estimated bit error rate for the data read during the read scan operation; and
    a calibration circuit configured to calibrate memory cells based on read levels determined by the read scan circuit.

19. The system of claim 18, wherein the read scan circuit is configured to:
  determine a first read level for reading data programmed to a first set of memory cells of the storage block, the first set of memory cells having one of the two memory states;
  determine the correlation between the two memory states;
  determine a second read level for reading data programmed to a second set of memory cells of the storage block, the second set of memory cells having one of two other memory states, the second read level determined based on the correlation between at least one of the two memory states and at least one of the two other memory states;
  set the first read level as a current read level for reading data from the first set of memory cells; and
  set the second read level as a current read level for reading data from the second set of memory cells.

20. The system of claim 18, wherein the correlation comprises one or more of a width correlation and a shift correlation.

* * * * *